(12) United States Patent
Lin et al.

(10) Patent No.: US 11,139,379 B2
(45) Date of Patent: Oct. 5, 2021

(54) SEMICONDUCTOR STRUCTURE AND METHOD FOR FORMING THE SAME

(71) Applicant: Taiwan Semiconductor Manufacturing Co., Ltd., Hsinchu (TW)

(72) Inventors: Zhi-Chang Lin, Zhubei (TW);
Shih-Cheng Chen, New Taipei (TW);
Kuo-Cheng Chiang, Zhubei (TW);
Pei-Hsun Wang, Kaohsiung (TW);
Chih-Hao Wang, Baoshan Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/744,459

(22) Filed: Jan. 16, 2020

(65) Prior Publication Data
US 2021/0226020 A1    Jul. 22, 2021

(51) Int. Cl.
| H01L 29/417 | (2006.01) |
| H01L 29/06 | (2006.01) |
| H01L 29/423 | (2006.01) |
| H01L 29/40 | (2006.01) |
| H01L 21/8238 | (2006.01) |

(52) U.S. Cl.
CPC .......... *H01L 29/41791* (2013.01); *H01L 21/823814* (2013.01); *H01L 29/0665* (2013.01); *H01L 29/0673* (2013.01); *H01L 29/0676* (2013.01); *H01L 29/401* (2013.01); *H01L 29/4238* (2013.01); *H01L 29/42376* (2013.01)

(58) Field of Classification Search
CPC .................. H01L 21/823814; H01L 29/0673
See application file for complete search history.

(56) References Cited

U.S. PATENT DOCUMENTS

| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2019/0355723 | A1* | 11/2019 | Miao ............... H01L 27/092 |
| 2020/0006333 | A1* | 1/2020 | Noh ................ H01L 21/02636 |

* cited by examiner

*Primary Examiner* — Farun Lu
(74) *Attorney, Agent, or Firm* — Birch, Stewart, Kolasch & Birch, LLP

(57) ABSTRACT

A semiconductor structure is provided. The semiconductor structure includes nanostructures over a substrate, a gate stack around the nanostructures, a gate spacer layer alongside the gate stack, an inner spacer layer between the gate spacer layer and the nanostructures, a source/drain feature adjoining the nanostructures, a contact plug over the source/drain feature, and a silicon germanium layer along the surface of the source/drain feature and between the contact plug and the inner spacer layer.

20 Claims, 27 Drawing Sheets

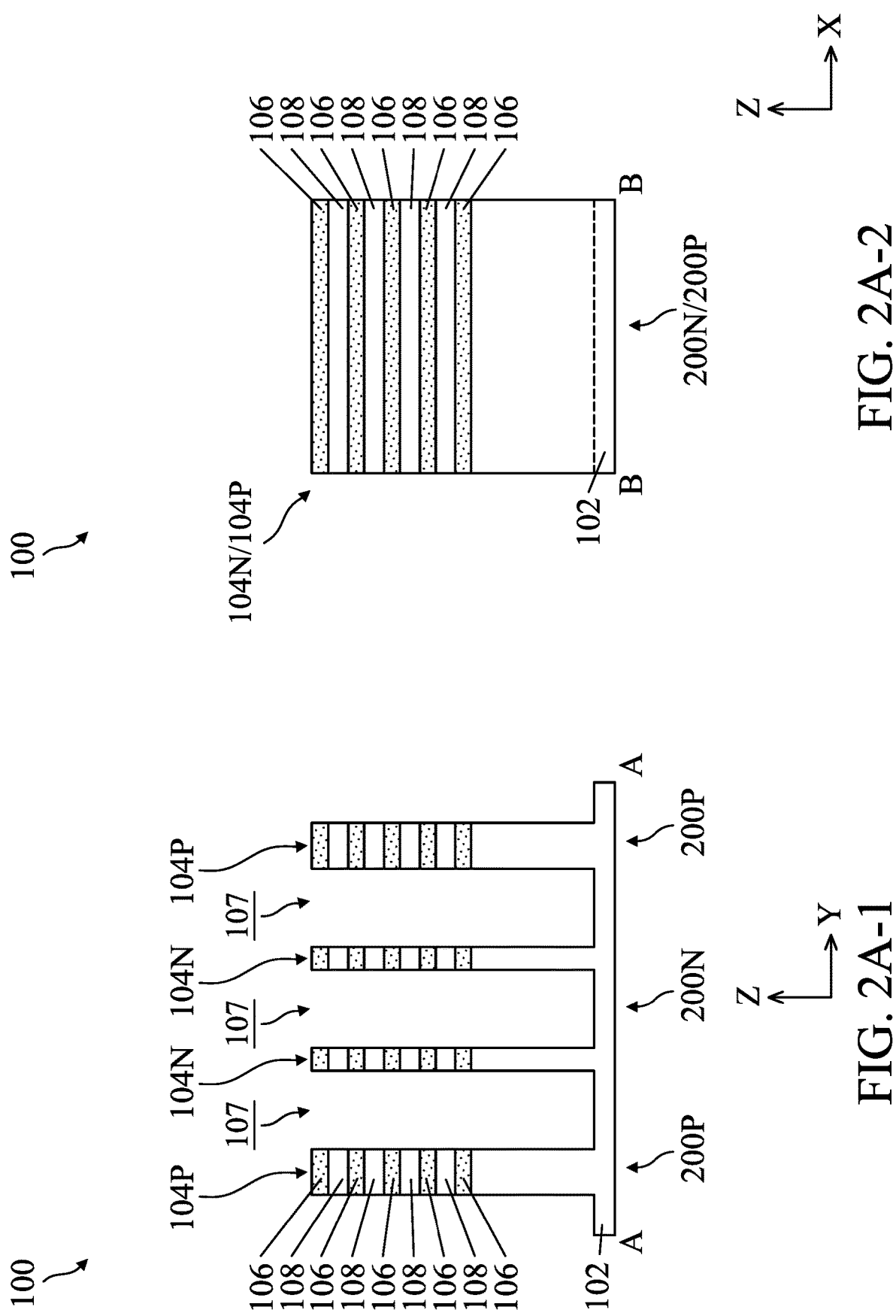

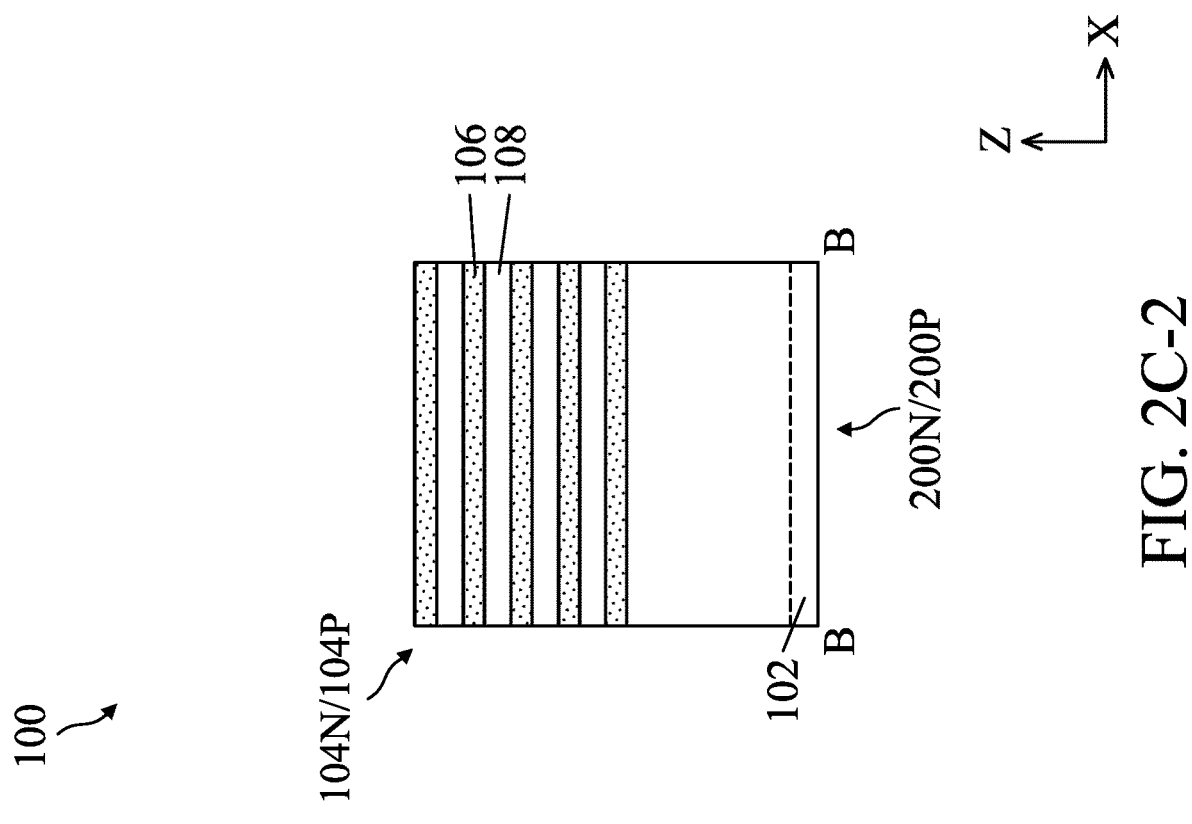
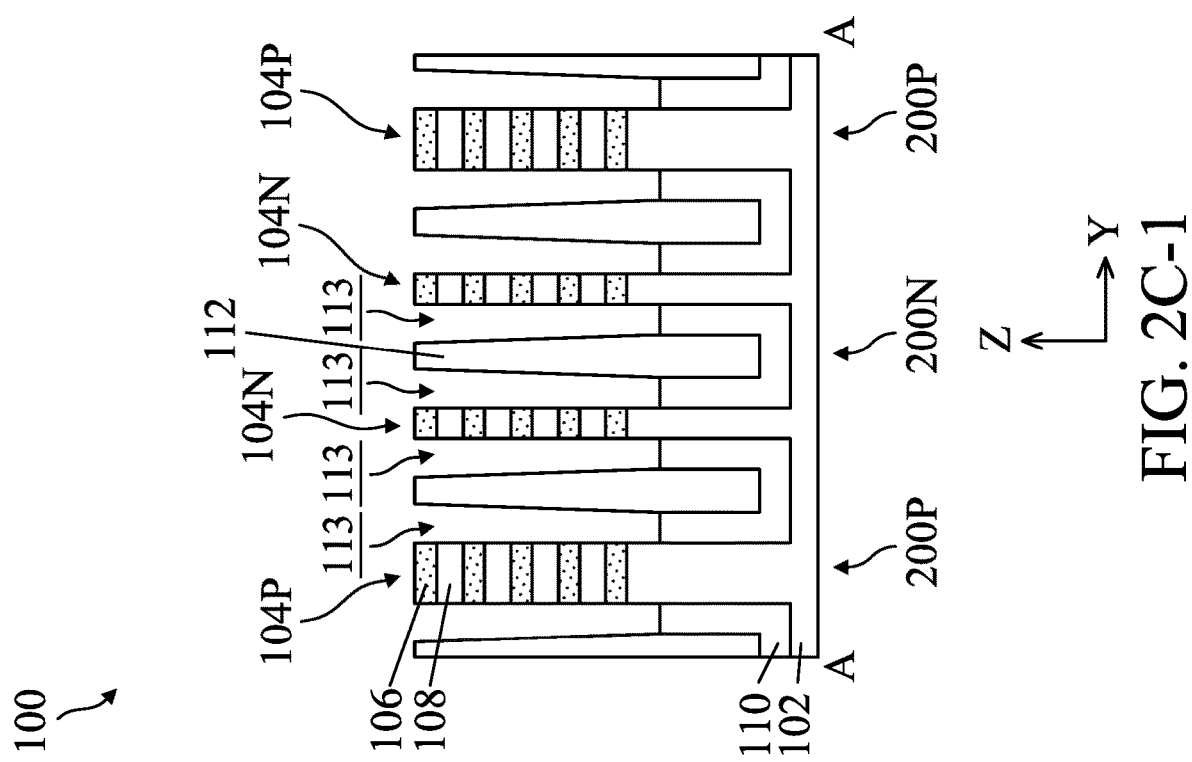
FIG. 2C-1
FIG. 2C-2

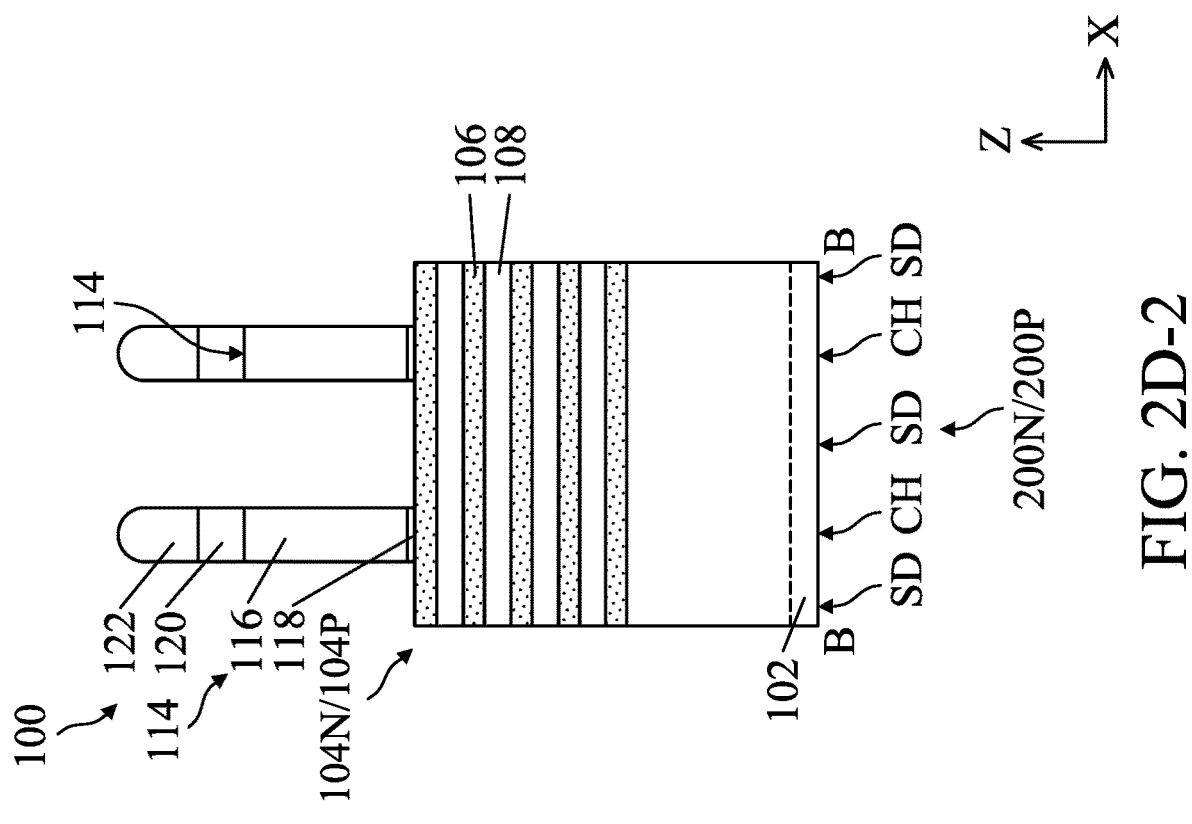
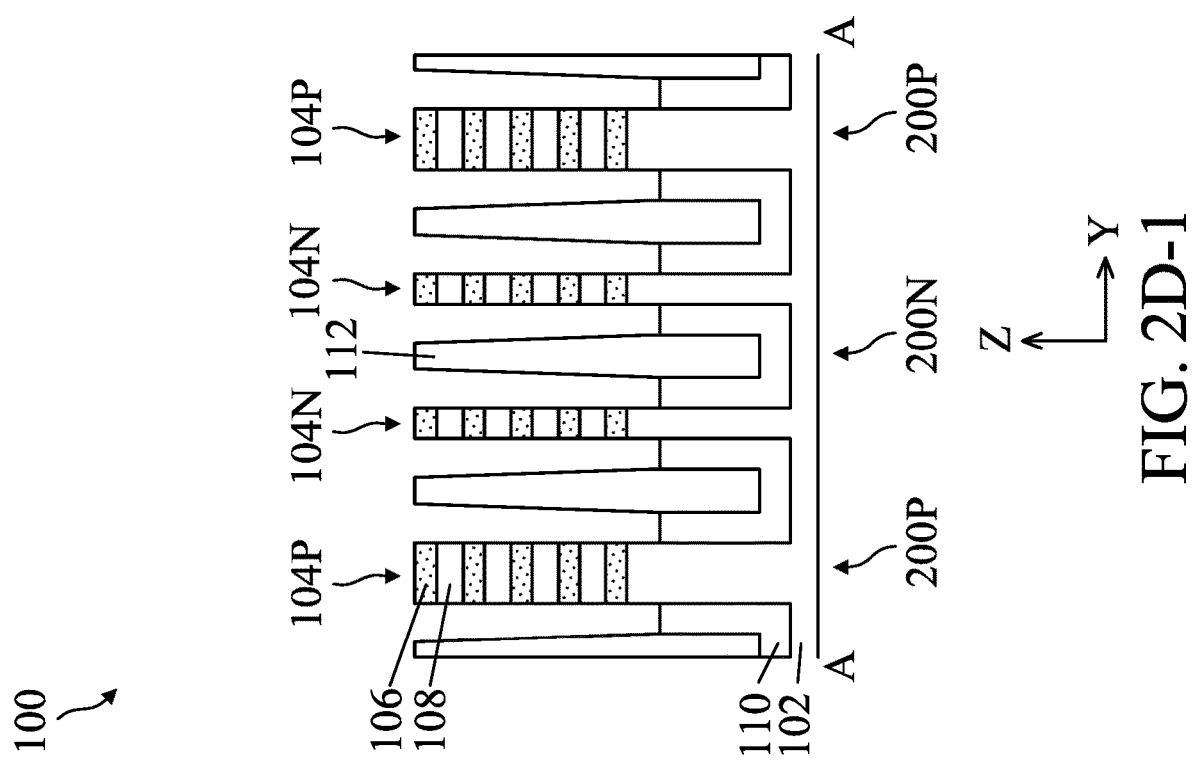

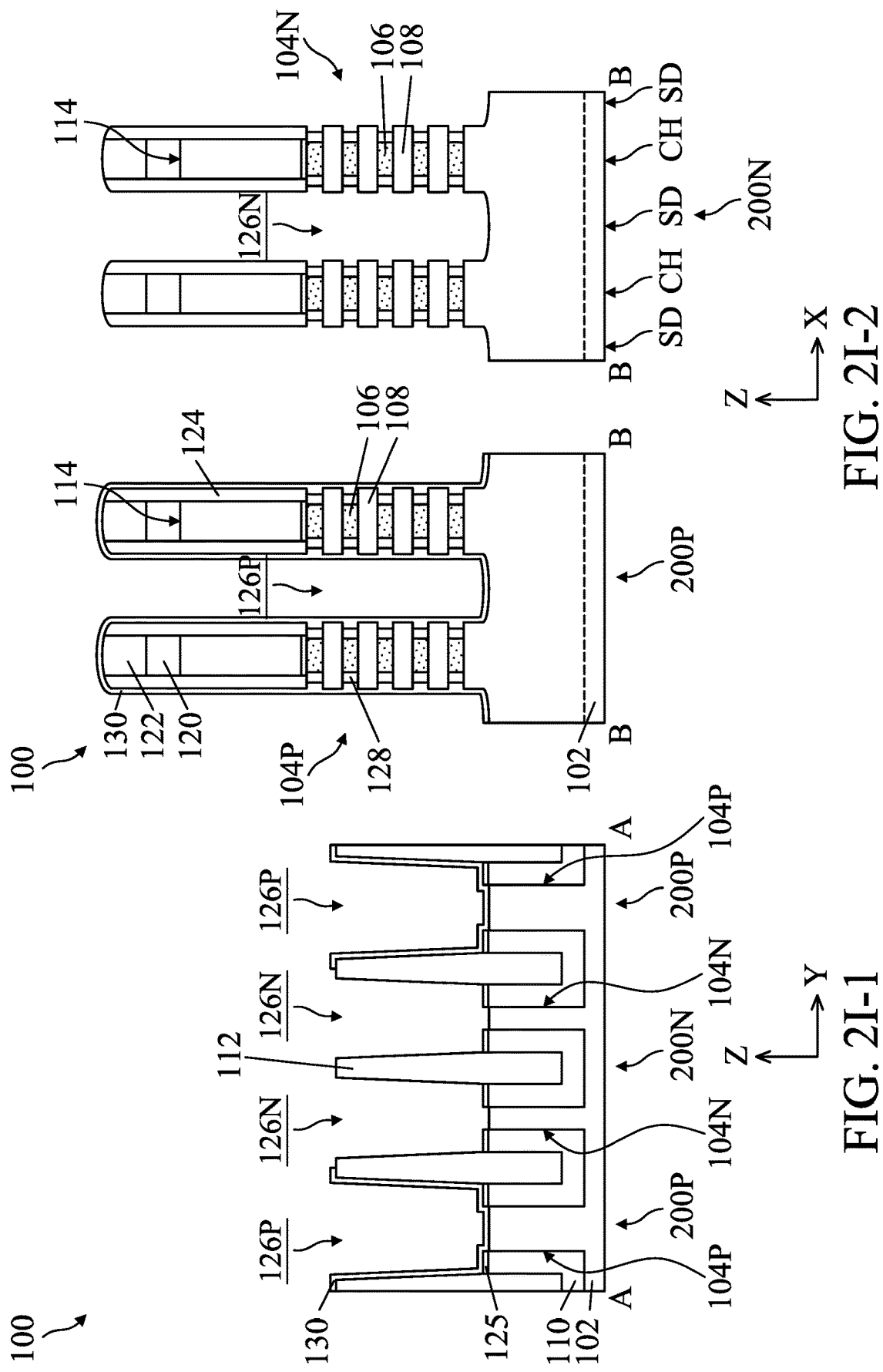

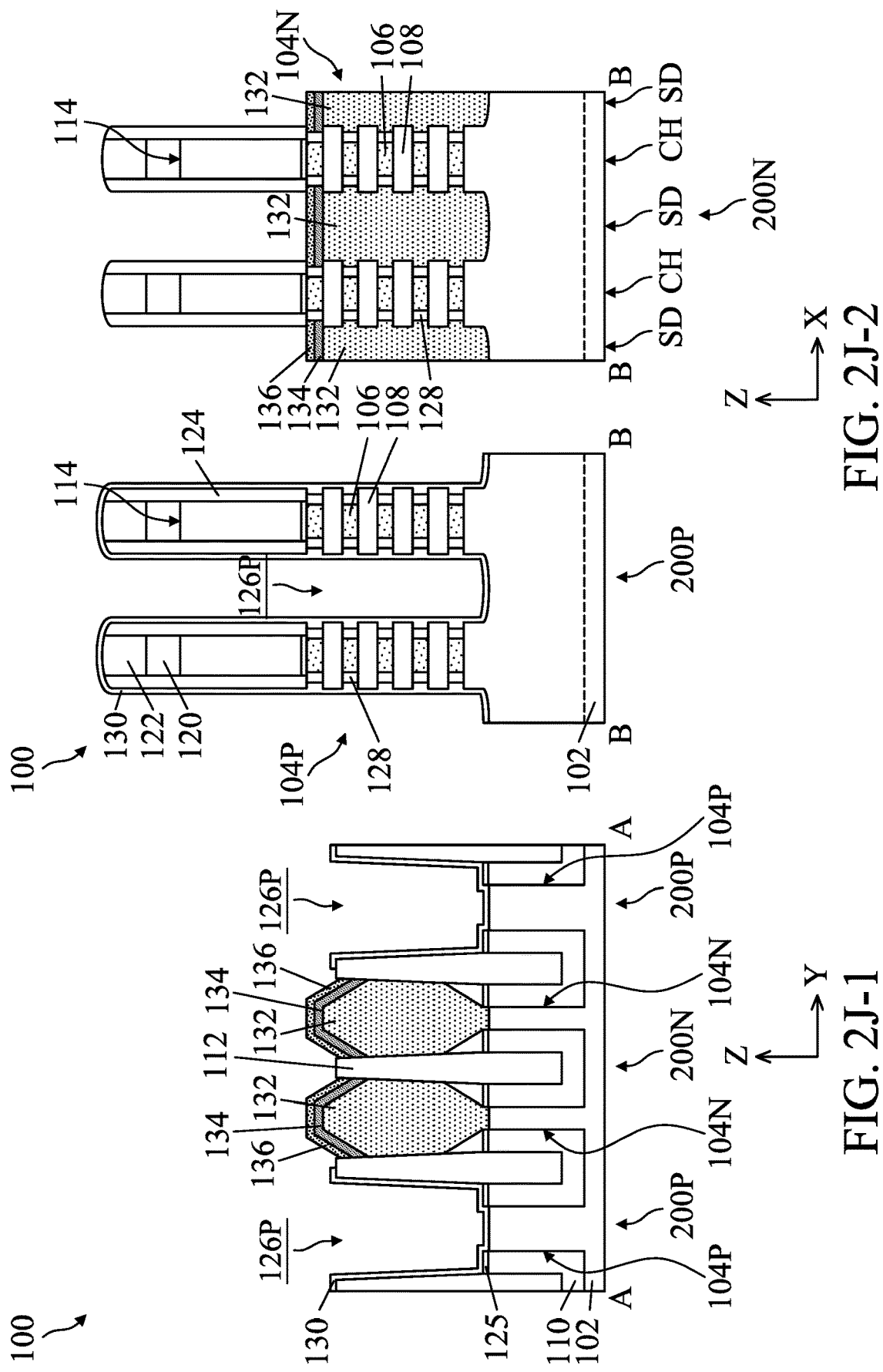

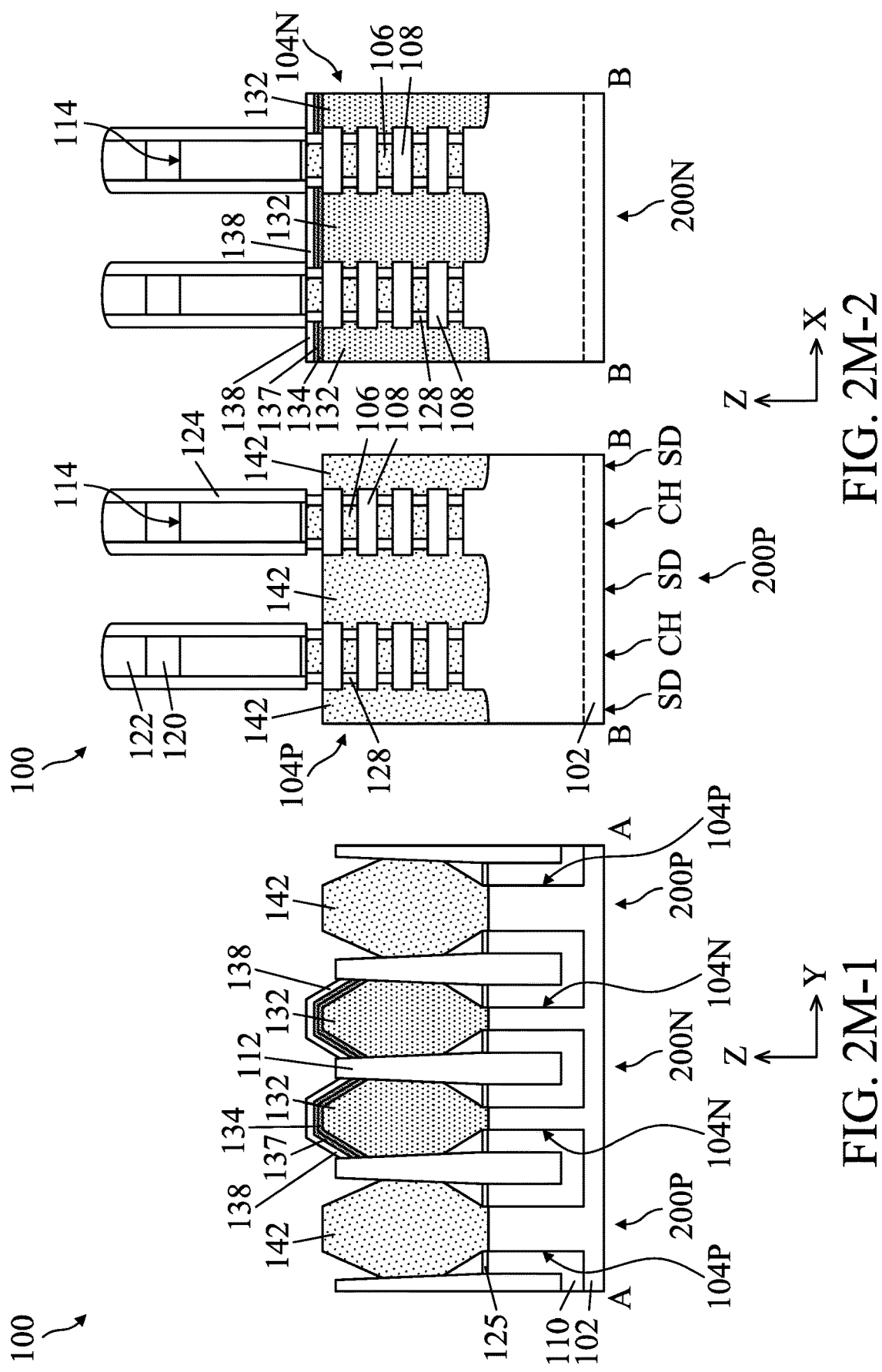

SEMICONDUCTOR STRUCTURE AND METHOD FOR FORMING THE SAME

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes and their structure allows them to be aggressively scaled-down while maintaining gate control and mitigating SCEs. In conventional processes, GAA devices provide a channel in a silicon nanowire. However, integration of fabrication of the GAA features around the nanowire can be challenging. For example, while the current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-1 through 2R-2 are cross-sectional views illustrating the formation of a semiconductor structure at various intermediate stages, in accordance with some embodiments of the disclosure.

FIGS. 3-1 and 3-2 are enlarged views of area A of FIG. 2R-1 and area B of FIG. 2R-2 respectively to further illustrate additional details, in accordance with some embodiments.

FIGS. 4-1 and 4-2 are a modification of the cross-section views of FIGS. 3-1 and 3-2, in accordance with some embodiments.

FIG. 6-1 is a top view of a part of a statistic random-access memory structure, in accordance with some embodiments of the disclosure.

FIGS. 6-2 and 6-3 are cross-section views of a part of the statistic random-access memory structure of FIG. 6-1, in accordance with some embodiments of the disclosure.

DETAILED DESCRIPTION

Figure 1:
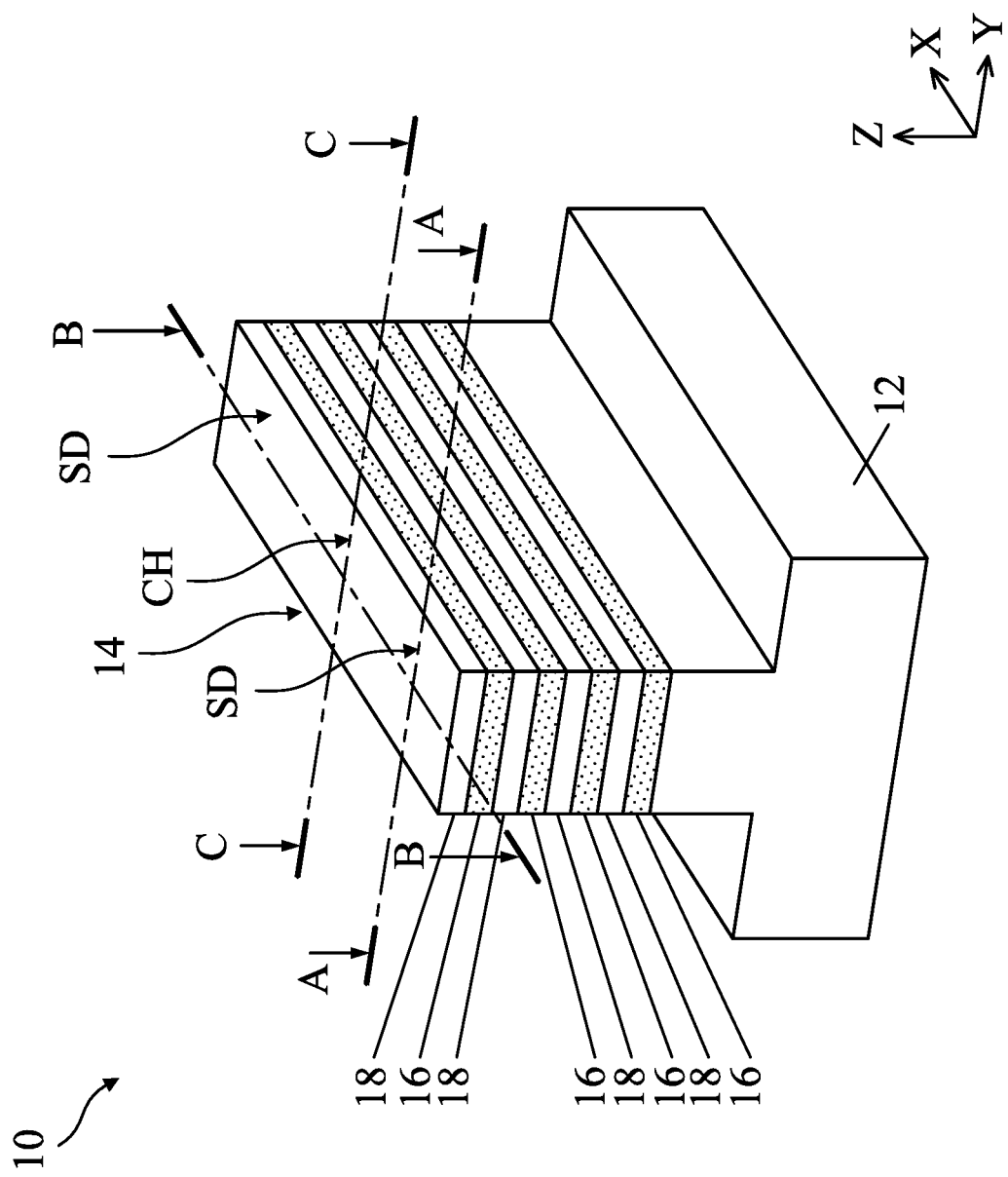
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of a method for forming a semiconductor structure are provided. The semiconductor structure may include nanostructures over a substrate. A gate stack may be formed around the nanostructures. During the formation of the semiconductor structure, a first source/drain feature is formed in a first source/drain recess in a first region of the substrate while a second region of the substrate is covered by a mask element. A silicon germanium layer may be formed self-aligned over the first source/drain feature and oxidized to form a silicon oxide layer. The mask element may be removed and a second source/drain feature may be formed in the second source/drain recess in the second region of the substrate. The silicon oxide layer is self-aligned over the first source/drain feature to serve as a mask element during the formation of the second source/drain feature. Therefore, an additional photolithography process is not required and the risk of CD/overlay shift may be avoided.

FIG. 1 is a perspective view of a semiconductor structure, in accordance with some embodiments of the disclosure. For a better understanding of the semiconductor structure, an X-Y-Z coordinate reference is provided in FIG. 1. The X-axis and Y-axis are generally orientated along the lateral directions that are parallel to the main surface of the semiconductor structure. The Y-axis is transverse (e.g., substantially perpendicular) to the X-axis. The Z-axis is generally oriented along the vertical direction that is perpendicular to the main surface of a semiconductor structure (or the X-Y plane).

A semiconductor structure 10 is provided, as shown in FIG. 1, in accordance with some embodiments. The semiconductor structure 10 includes a substrate 12, and a fin structure 14 over the substrate 12, in accordance with some embodiments.

The fin structure 14 extends in the X direction, in accordance with some embodiments. That is, the fin structure 14 has a longitudinal axis parallel to the X direction, in accordance with some embodiments. The fin structure 14 includes a lower portion formed by a portion of the substrate 12 and an upper portion formed by a stacked semiconductor structure, in accordance with some embodiments. The stacked semiconductor structure includes first semiconductor layers 16 and second semiconductor layers 18 alternately stacked over the lower portion, in accordance with some embodiments.

The fin structure 14 includes a channel region CH and source/drain regions SD, where the channel region CH is defined between the source/drain regions SD, in accordance with some embodiments. FIG. 1 shows one channel region CH and two source/drain regions SD for illustrative purpose and is not intended to be limiting. The number of the channel region CH and the source/drain region SD may be dependent on the semiconductor device design demand and/or performance consideration. Gate structures (not shown) will be formed with a longitudinal axis parallel to the Y direction and extending across the channel regions of the fin structure.

FIG. 1 further illustrates a reference cross-section that is used in later figures. Cross-section A-A is in a plan across the source/drain region SD of the fin structure and parallel to the longitudinal axis of a gate structure, in accordance with some embodiments. Cross-section B-B is in a plane along the longitudinal axis of the fin structure, in accordance with some embodiments. Cross-section C-C is in a plane across the channel region CH of the fin structure along the longitudinal axis of a gate structure, in accordance with some embodiments.

FIGS. 2A-1 through 2R-2 are cross-sectional views illustrating the formation of a semiconductor structure at various intermediate stages, in accordance with some embodiments of the disclosure.

Figures 2, 2B:
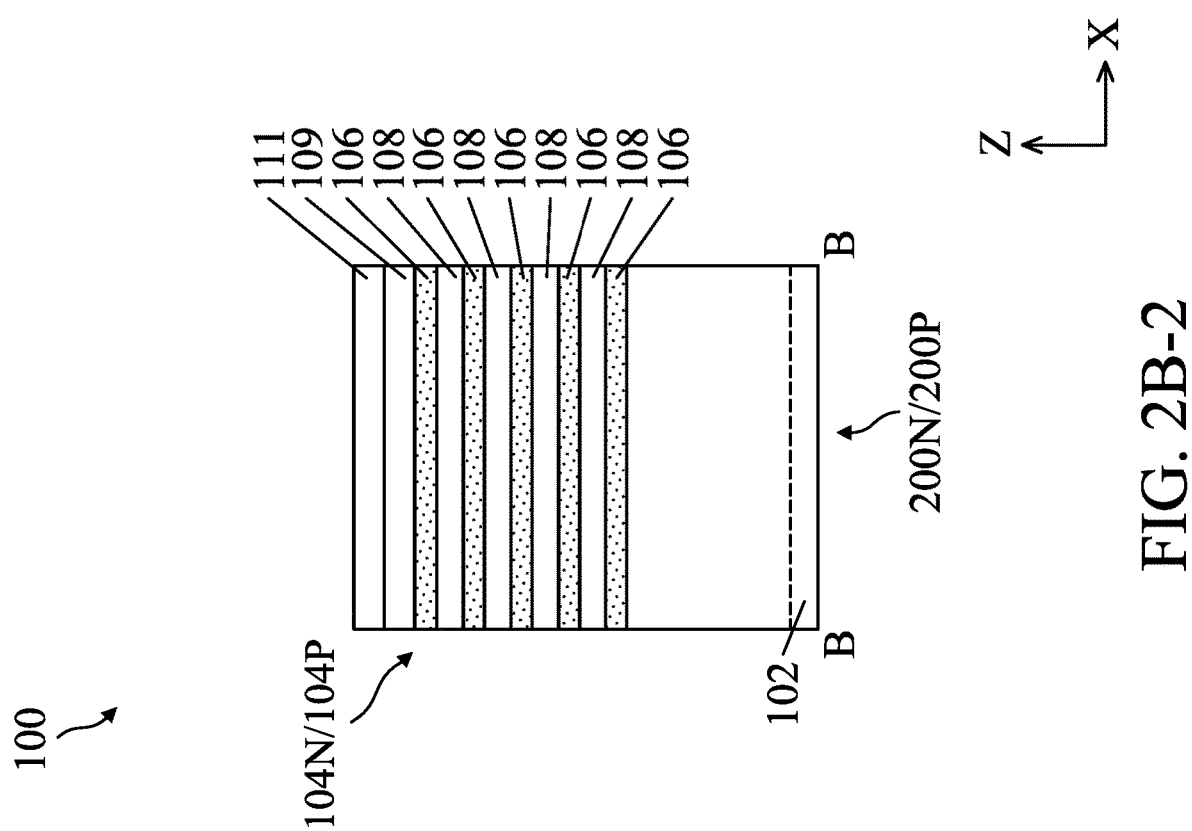
Figures 1, 2B:
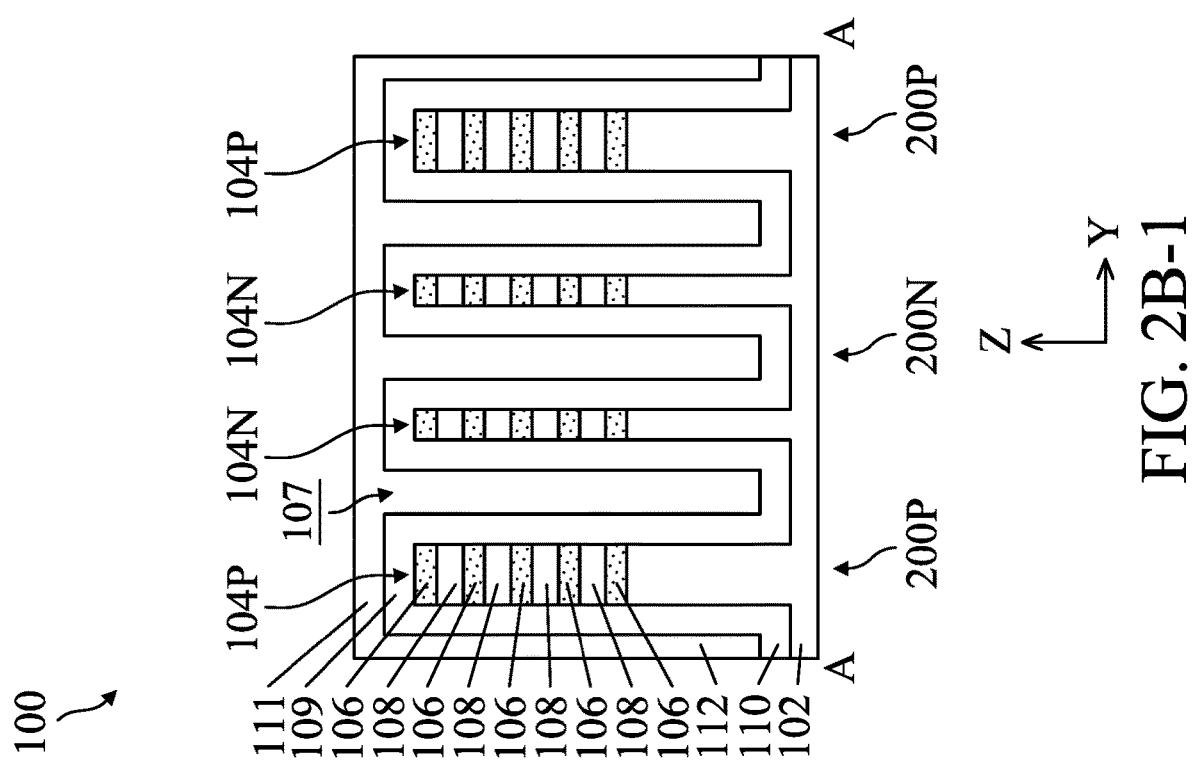

FIGS. 2A-1 and 2A-2 are cross-sectional views of a semiconductor structure 100 including fin structures 104N and 104P, in accordance with some embodiments. FIG. 2A-1 corresponds to cross-section A-A of FIG. 1 and FIG. 2A-2 corresponds to cross-section B-B of FIG. 1.

The semiconductor structure 100 includes a substrate 102, as shown in FIGS. 2A-1 and 2A-2, in accordance with some embodiments. Fin structures 104N and fin structures 104P are formed over the substrate 102, in accordance with some embodiments.

In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

The substrate 102 includes an NMOS region 200N where the fin structures 104N are formed and PMOS regions 200P where the fin structures 104P are formed, as shown in FIGS. 2A-1 and 2A-2, in accordance with some embodiments. The NMOS region 200N is between PMOS regions 200P, in accordance with some embodiments. The fin structures 104N are N-type fin structures and used to form N-type semiconductor devices (e.g., N-channel gate-all-around transistors) and the fin structures 104P are P-type fin structures and used to form P-type semiconductor devices (e.g., P-channel gate-all-around transistors), in accordance with some embodiments.

The fin structures 104N and 104P extend in the X direction, in accordance with some embodiments. That is, the fin structures 104N and 104P have longitudinal axes parallel to the X direction, in accordance with some embodiments. In some embodiments, the fin structures 104N and 104P are arranged in the Y direction. Each of the fin structures 104N and 104P includes a semiconductor stack which includes first semiconductor layers 106 and second semiconductor layers 108 alternately stacked. In some embodiments, the semiconductor stack includes five first semiconductor layers 106 and four second semiconductor layers 108 interposing therein, as shown in FIGS. 2A-1 and 2A-2.

As explained in detail below, the first semiconductor layers 106 of the fin structures 104N and 104P will be removed and the second semiconductor layers 108 of the fin structures 104N and 104P form nanostructures (e.g., nanowire or nanosheet structures) that laterally extend between source/drain features and serve as the channel layers for the resulting transistors such as gate-all-around transistors, in accordance with some embodiments. As the term is used herein, "nanostructures" refers to semiconductor layers that have cylindrical shape, bar shaped and/or sheet shape. Gate structures (not shown) will be formed across and wrap around the nanostructures and interpose source/drain features, in accordance with some embodiments. For example, the embodiments described herein illustrate processes and materials that may be used to form nanostructures with a GAA design for n-channel FinFETs and p-channel FinFETs.

In some embodiments, the formation of the fin structures 104N and 104P include forming a stacked semiconductor structure including a first semiconductor material for the first semiconductor layers 106 and a second semiconductor material for the second semiconductor layers 108 over the substrate 102.

The first semiconductor material for the first semiconductor layers 106 has a different lattice constant than the second semiconductor material for the second semiconductor layers 108, in accordance with some embodiments. In some embodiments, the first semiconductor material and the second semiconductor material have different oxidation rates and/or etching selectivity. In some embodiments, the first semiconductor layers 106 are made of SiGe, where the percentage of germanium (Ge) in the SiGe is in a range from about 20 atomic % to about 50 atomic %, and the second semiconductor layers 108 are made of silicon. In some embodiments, the first semiconductor layers 106 are $Si_{1-x}Ge_x$, where x is more than about 0.3, or Ge (x=1.0) and the second semiconductor layers 108 are Si or $Si_{1-y}Ge_y$, where y is less than about 0.4, and x>y.

In some embodiments, the first semiconductor material and the second semiconductor material are alternatingly formed using an epitaxial growth process such as molecular beam epitaxy (MBE), metal organic chemical vapor deposition (MOCVD), or vapor phase epitaxy (VPE), or another suitable technique. In some embodiments, the thickness of each of the first semiconductor layers 106 is in a range from about 1.5 nanometers (nm) to about 20 nm. In some embodiments, the thickness of each of the second semiconductor layers 108 is in a range from about 1.5 nm to about 20 nm.

Afterward, the stacked semiconductor structure including the first semiconductor material and the second semiconductor material and the underlying substrate 102 are patterned into the fin structures 104N in the NMOS region 200N and the fin structures 104P in the PMOS region 200P, in accordance with some embodiments. In some embodiments, the patterning process includes forming a patterned hard mask layer (not shown) over the stacked semiconductor structure, and etching the stacked semiconductor structure and the substrate 102 uncovered by the patterned hard mask layer to form trenches 107 and the fin structures 104N and 104P. In some embodiments, after the etching process, the substrate 102 has portions which protrude from between the trenches 107 to form lower portions of the fin structures 104N and 104P. In some embodiments, the remainder of the stacked semiconductor structure directly above the lower portion forms upper portions of the fin structures 104N and 104P.

FIGS. 2B-1 and 2B-2 are cross-sectional views of a semiconductor structure 100 after the formation of an insulating material 109 and a dielectric material 111, in accordance with some embodiments of the disclosure. FIG. 2B-1 corresponds to cross-section A-A of FIG. 1 and FIG. 2B-2 corresponds to cross-section B-B of FIG. 1.

An insulating material 109 is conformally formed along the sidewalls and the upper surfaces of the fin structures 104N and 104P and the upper surface of the substrate 102, as shown in FIGS. 2B-1 and 2B-2, in accordance with some embodiments. The insulating material 109 partially fills the trenches 107, in accordance with some embodiments. The dielectric material 111 is formed over the insulating material 109 and fills the remainder of the trenches 107, in accordance with some embodiments.

In some embodiments, the insulating material 109 includes silicon oxide ($SiO_2$), silicon nitride (SiN), silicon oxynitride (SiON), another suitable insulating material, multilayers thereof, and/or a combination thereof. In some embodiments, the insulating material 109 is formed using chemical vapor deposition (CVD) such as low pressure CVD (LPCVD), plasma enhanced CVD (PECVD), high density plasma CVD (HDP-CVD), high aspect ratio process (HARP), flowable CVD (FCVD), atomic layer deposition (ALD), another suitable technique, and/or a combination thereof.

In some embodiments, the dielectric material 111 includes silicon nitride (SiN) silicon carbon nitride (SiCN), silicon oxynitride (SiON), silicon carbon oxynitride SiCON, hafnium oxide ($HfO_2$), lanthanum oxide ($La_2O_3$), aluminum oxide ($Al_2O_3$), zirconium oxide ($ZrO_2$), another suitable insulating material, multilayers thereof, and/or a combination thereof. In some embodiments, the dielectric material 111 is formed using CVD such as LPCVD, PECVD, HDP-CVD, HARP, FCVD, ALD, another suitable technique, and/or a combination thereof.

FIGS. 2C-1 and 2C-2 are cross-sectional views of a semiconductor structure 100 after the formation of an isolation structure 110 and dielectric fin structures 112, in accordance with some embodiments of the disclosure. FIG. 2C-1 corresponds to cross-section A-A of FIG. 1 and FIG. 2C-2 corresponds to cross-section B-B of FIG. 1.

A portion of the dielectric material 111 above the upper surface of the insulating material 109 is removed until the insulating material 109 is exposed, in accordance with some embodiments of the disclosure. In some embodiments, the removal process is an etching-back process or a chemical mechanical polishing (CMP) process. The insulating material 109 and the dielectric material 111 are then planarized using such as a chemical mechanical polishing process to remove portions of insulating material 109 and the dielectric material 111 formed above the upper surfaces of the fin structures 104N and 104P. The remainder of the dielectric material 111 forms dielectric fin structures 112, as shown in FIG. 2C-1, in accordance with some embodiments of the disclosure.

Afterward, the insulating material 109 is recessed using an etch-back process to form gaps 113 between the fin structures 104N/104P and the dielectric fin structures 112, as shown in FIG. 2C-1, in accordance with some embodiments. The gaps 113 expose the semiconductor stacks of the fin structures 104N and 104P and upper portions of the dielectric fin structures 112, in accordance with some embodiments. The remainder of the insulating material 109 forms isolation structure 110, as shown in FIG. 2C-1, in accordance with some embodiments of the disclosure. The isolation structure 110 surrounds lower portions of the fin structures 104N and 104P and the dielectric fin structures 112, in accordance with some embodiments. The isolation structures 110 may be referred to as shallow trench isolation (STI) feature. In some embodiments, the isolation structures 110 includes vertical portions separating the fin structures 104N/104P from the dielectric fin structures 112 and horizontal portions extending below the dielectric fin structures 112.

In some embodiments, the dielectric fin structures 112 extend in the X direction. That is, the dielectric fin structures 112 have longitudinal axes parallel to the X direction and substantially parallel to the fin structures 104N and 104P, in accordance with some embodiments. In some embodiments, a portion of the dielectric fin structure 112 protruding above the isolation structures 110 has a height of about 5 nm to about 100 nm. In some embodiments, the dimension of the dielectric fin structure 112 measured in the Y direction is in a range from about 5 nm to about 100 nm.

Figures 2, 2D, 3:
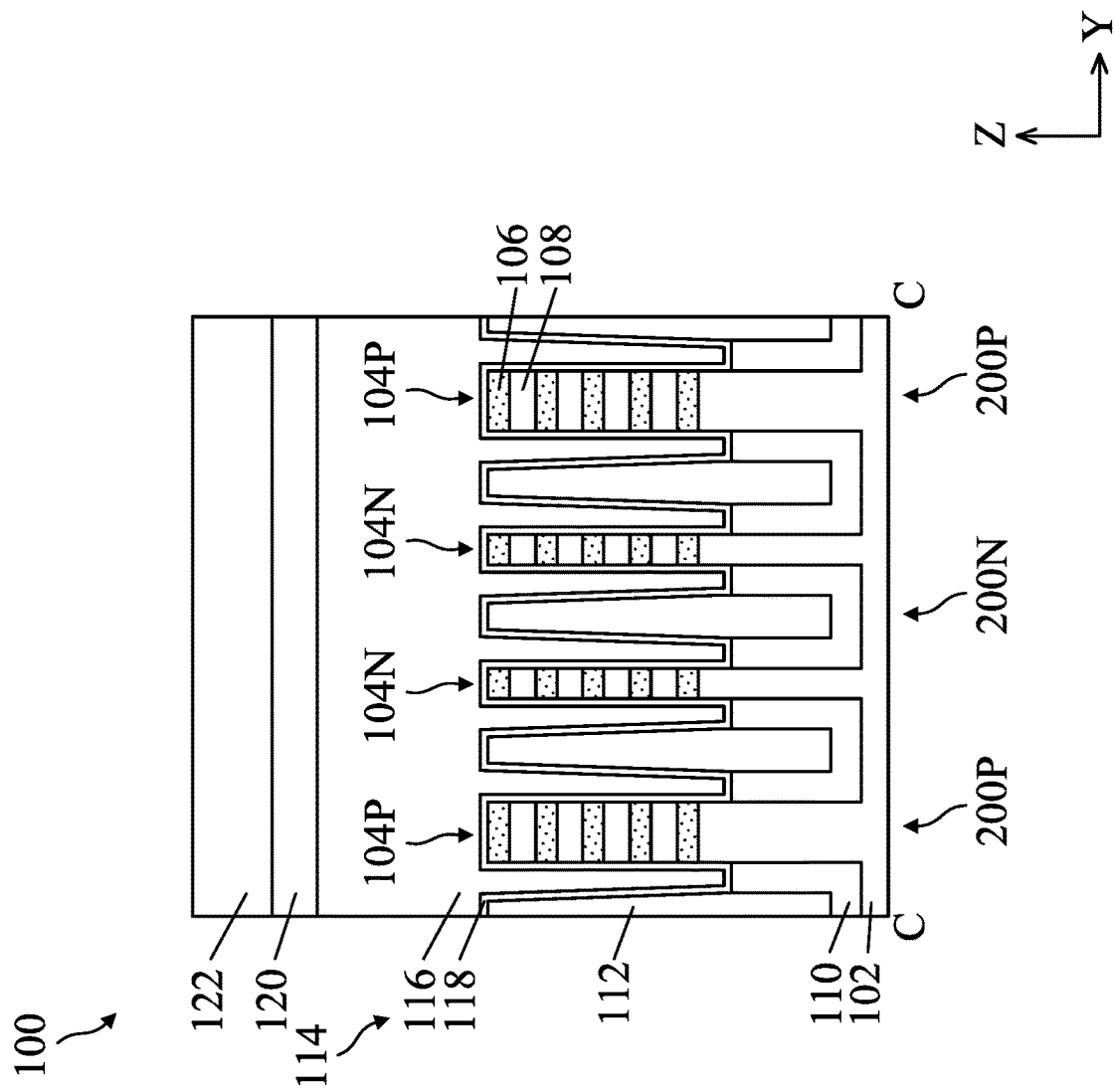

FIGS. 2D-1, 2D-2 and 2D-3 are cross-sectional views of a semiconductor structure 100 after the formation of dummy gate structures 114, in accordance with some embodiments of the disclosure. FIG. 2D-1 corresponds to cross-section A-A of FIG. 1; FIG. 2D-2 corresponds to cross-section B-B of FIG. 1; and FIG. 2D-3 corresponds to cross-section C-C of FIG. 1.

Dummy gate structures 114 are formed over the channel regions CH of the semiconductor structure 100, as shown in FIGS. 2D-2 and 2D-3, in accordance with some embodiments. In some embodiments, the dummy gate structures 114 extend in the Y direction. That is, the dummy gate structures 114 have longitudinal axes parallel to the Y direction, in accordance with some embodiments. In some embodiments, the dummy gate structures 114 are arranged in the X direction. The dummy gate structures 114 extend across and wrap the channel regions CH of the fin structures 104N and 104P, in accordance with some embodiments. The dummy gate structures 114 further extend across the dielectric fin structures 112, in accordance with some embodiments.

The dummy gate structures 114 each includes a dummy gate dielectric layer 118 and a dummy gate electrode layer 116 formed over the dummy gate dielectric layer 118, as shown in FIGS. 2D-2 and 2D-3, in accordance with some embodiments. In some embodiments, the dummy gate dielectric layers 118 are made of one or more dielectric materials, such as silicon oxide (SiO), silicon nitride (SiN), silicon oxynitride (SiON), $HfO_2$, HfZrO, HfSiO, HfTiO, HfAlO, and/or a combination thereof. In some embodiments, the dielectric material is formed using ALD, CVD, thermal oxidation, physical vapor deposition (PVD), another suitable technique, and/or a combination thereof.

In some embodiments, the dummy gate electrode layers 116 are made of a conductive material, such as polysilicon, poly-silicon germanium, metallic nitrides, metallic silicides, metals, and/or a combination thereof. In some embodiments, the conductive material is formed using CVD, another suitable technique, and/or a combination thereof.

In some embodiments, the formation of the dummy gate structures 114 includes conformally depositing a dielectric material for the dummy gate dielectric layers 118 over the semiconductor structure 100, depositing a conductive material for the dummy gate electrode layers 116 over the dielectric material, planarizing the conductive material, and patterning the dielectric material and the conductive material into the dummy gate structures 114. The patterning process may include forming etching masks 120 and 122 (such as patterned hard mask layer) over the conductive material to cover the channel regions CH of the fin structures 104N and 104P. In some embodiments, the etching mask 120 is made of nitride such as silicon nitride and the etching mask 122 is made of oxide such as silicon oxide. The conductive material and dielectric material, uncovered by the etching masks 120 and 122, may be etched away to expose the source/drain regions SD of the fin structures 104N and 104P.

Figures 2, 2E:
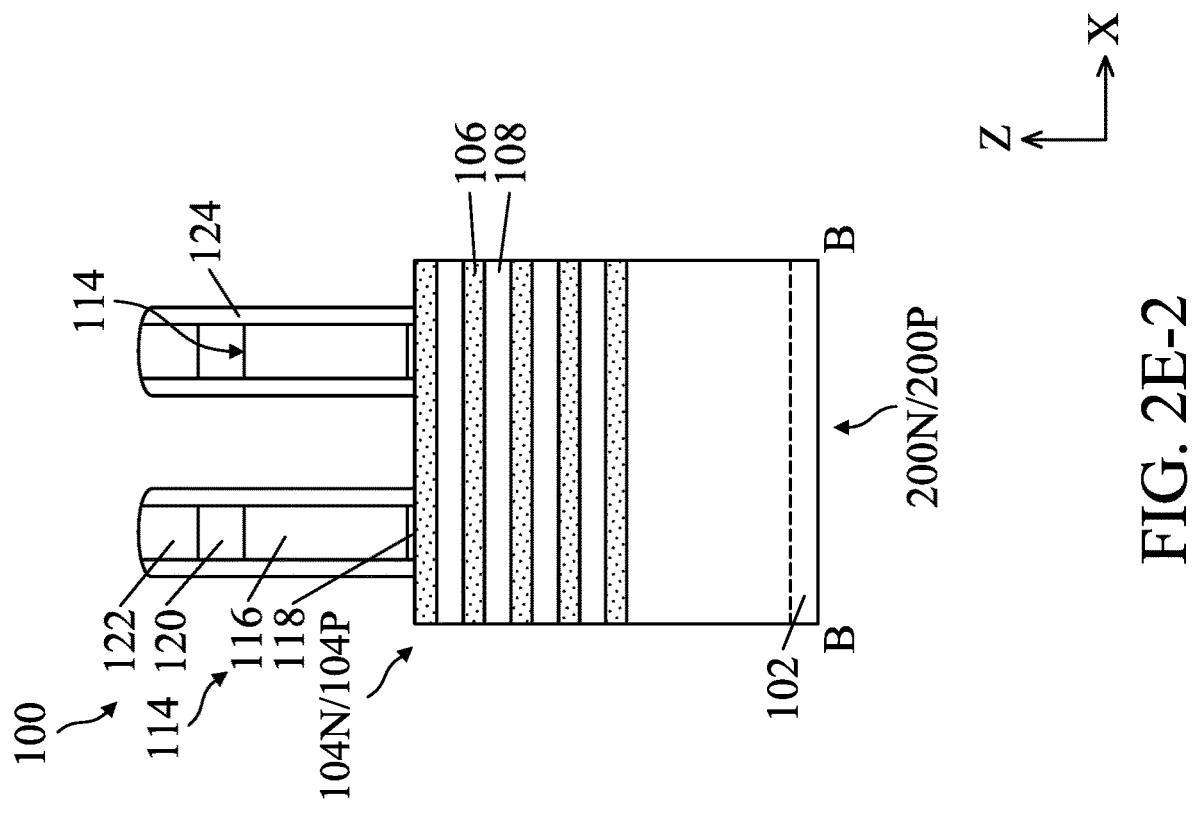
Figures 1, 2E:
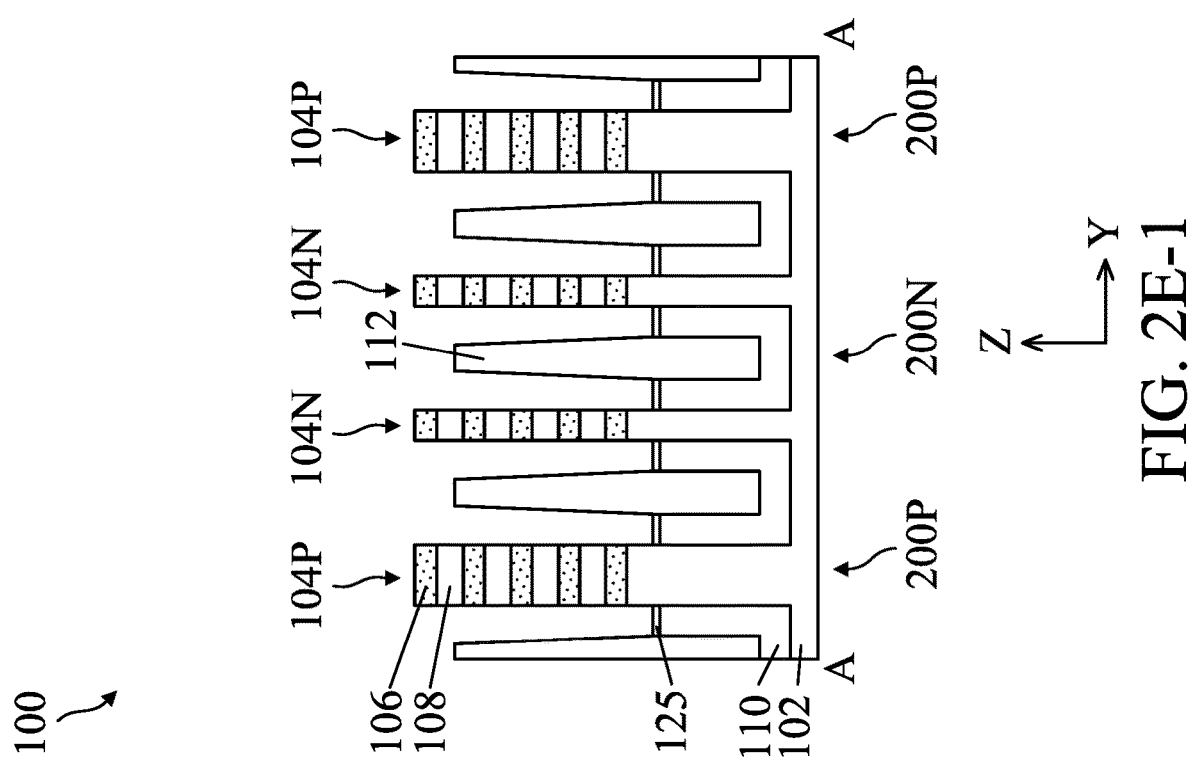

FIGS. 2E-1 and 2E-2 are cross-sectional views of a semiconductor structure 100 after the formation of gate spacer layers 124, in accordance with some embodiments of the disclosure. FIG. 2E-1 corresponds to cross-section A-A of FIG. 1 and FIG. 2E-2 corresponds to cross-section B-B of FIG. 1.

The gate spacer layers 124 are formed along and cover opposite sidewalls of the dummy gate structures 114, as shown in FIGS. 2E-2, in accordance with some embodiments. The gate spacer layers 124 are configured to offset the subsequently formed source/drain features and separate the source/drain features from the gate structure. In some embodiments, the gate spacer layers 124 are also formed along and cover opposite sidewalls of the etching masks 120 and 122. In some embodiments, the dimension of the gate spacer layer 124 measured in the X direction is in a range from about 1 nm to about 6 nm.

In some embodiments, the gate spacer layers 124 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. In some embodiments, the formation of the gate spacer layers 124 includes conformally depositing a dielectric material for the gate spacer layers 124 over the semiconductor structure 100 followed by an anisotropic etching process such as dry etching. In addition, after the anisotropic etching process, a portion of the dielectric material remains on the upper surface of the isolation structure 110 in the trenches 113 and is referred to fin spacer layers 125, as shown in FIG. 2E-1, in accordance with some embodiments.

Figures 2, 2F:
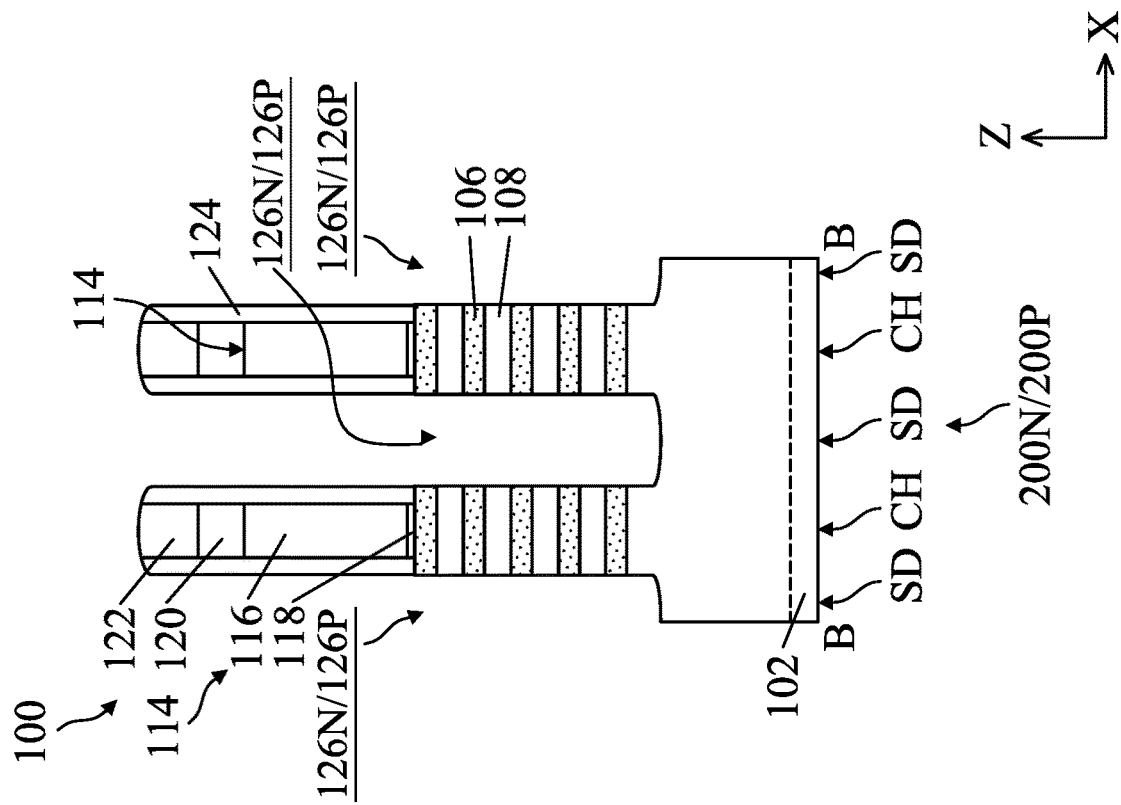
Figures 1, 2F:
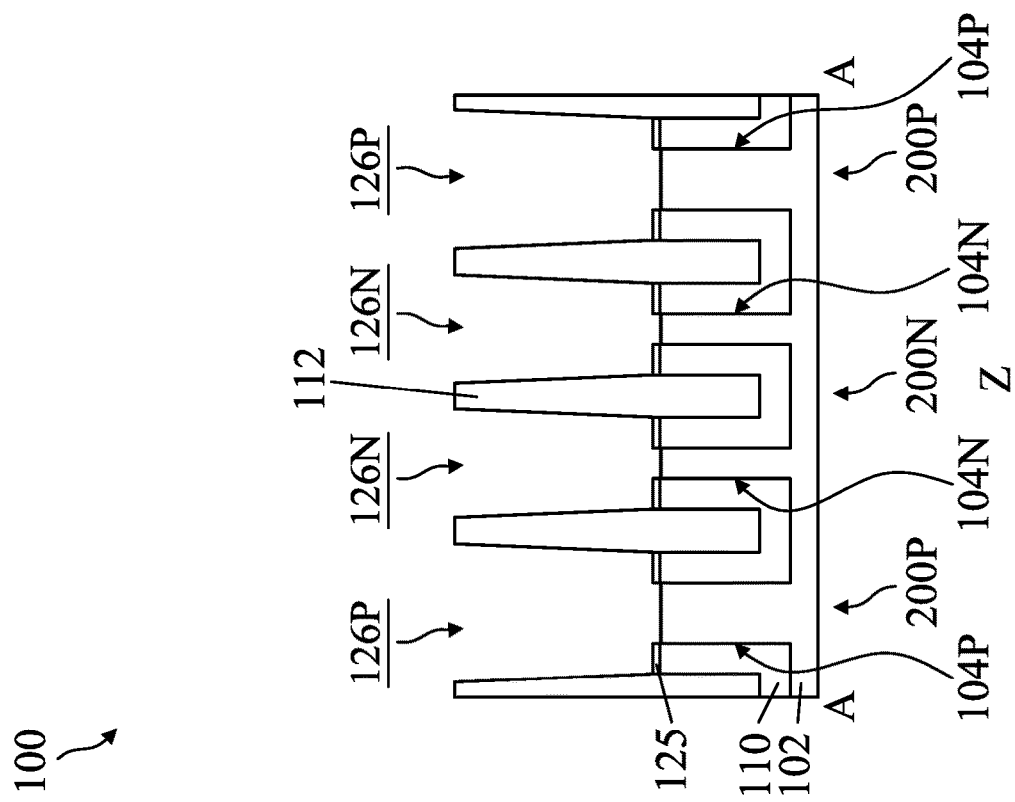

FIGS. 2F-1 and 2F-2 are cross-sectional views of a semiconductor structure 100 after the formation of source/drain recesses 126N and 126P, in accordance with some embodiments of the disclosure. FIG. 2F-1 corresponds to cross-section A-A of FIG. 1 and FIG. 2F-2 corresponds to cross-section B-B of FIG. 1.

The source/drain regions SD of the fin structures 104N and 104P are recessed using an etching process such as dry etching or wet etching to form source/drain recesses 126N in the NMOS region 200N and source/drain recesses 126P in the PMOS region 200P, as shown in FIGS. 2F-1 and 2F-2, in accordance with some embodiments. The bottom surfaces of the source/drain recesses 126N and 126P may extend to a position substantially level to or below the upper surface of the isolation structure 110, in accordance with some embodiments.

Figures 2, 2G:
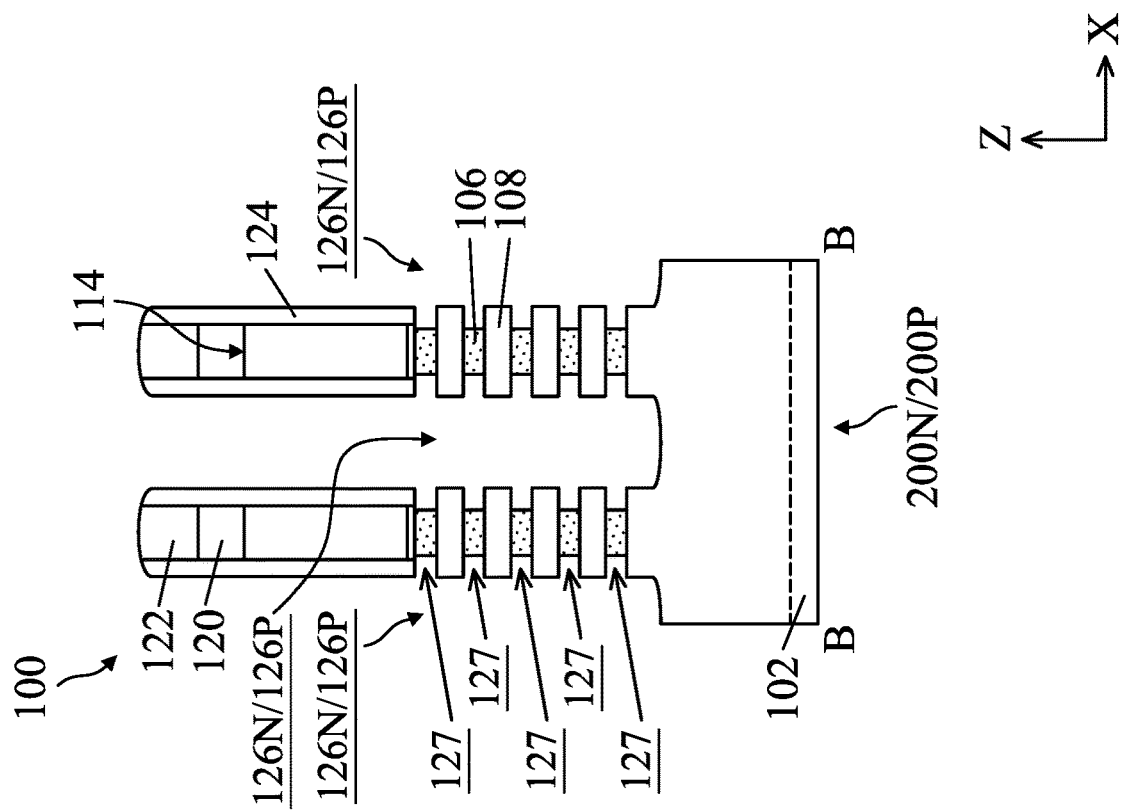
Figures 1, 2G:
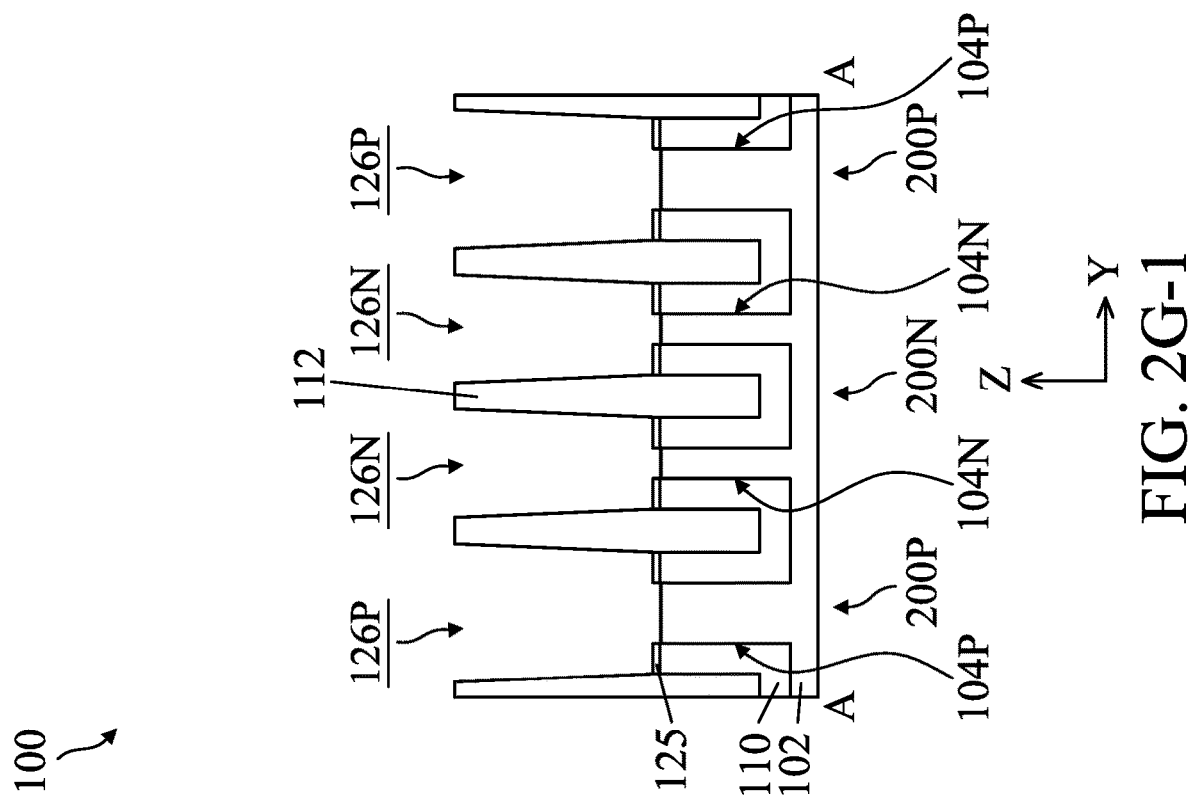

FIGS. 2G-1 and 2G-2 are cross-sectional views of a semiconductor structure 100 after the formation of notches 127, in accordance with some embodiments of the disclosure. FIG. 2G-1 corresponds to cross-section A-A of FIG. 1 and FIG. 2G-2 corresponds to cross-section B-B of FIG. 1.

An etching process is performed on the semiconductor structure 100 to laterally recess the first semiconductor layers 106 of the fin structures 104N and 104P from the source/drain recesses 126N and 126P to form notches 127, as shown in FIG. 2G-2, in accordance with some embodiments. The notches 127 are formed between the gate spacer layer 124 and the uppermost second semiconductor layer 108, between two neighboring second semiconductor layers 108, and between the lowermost second semiconductor layer 108 and the lower portions of the fin structures 104N/104P, in accordance with some embodiments. In some embodiments, the notches 127 extends from the source/drain region SD toward the channel region CH and exceed the inner sidewall of the gate spacer layer 124 facing the gate structure 114, in accordance with some embodiments. That is, in some embodiments, the notches 127 have a greater dimension measured in the X direction than the dimension of the gate spacer layer 124 measured in the X direction.

Figures 2, 2H:
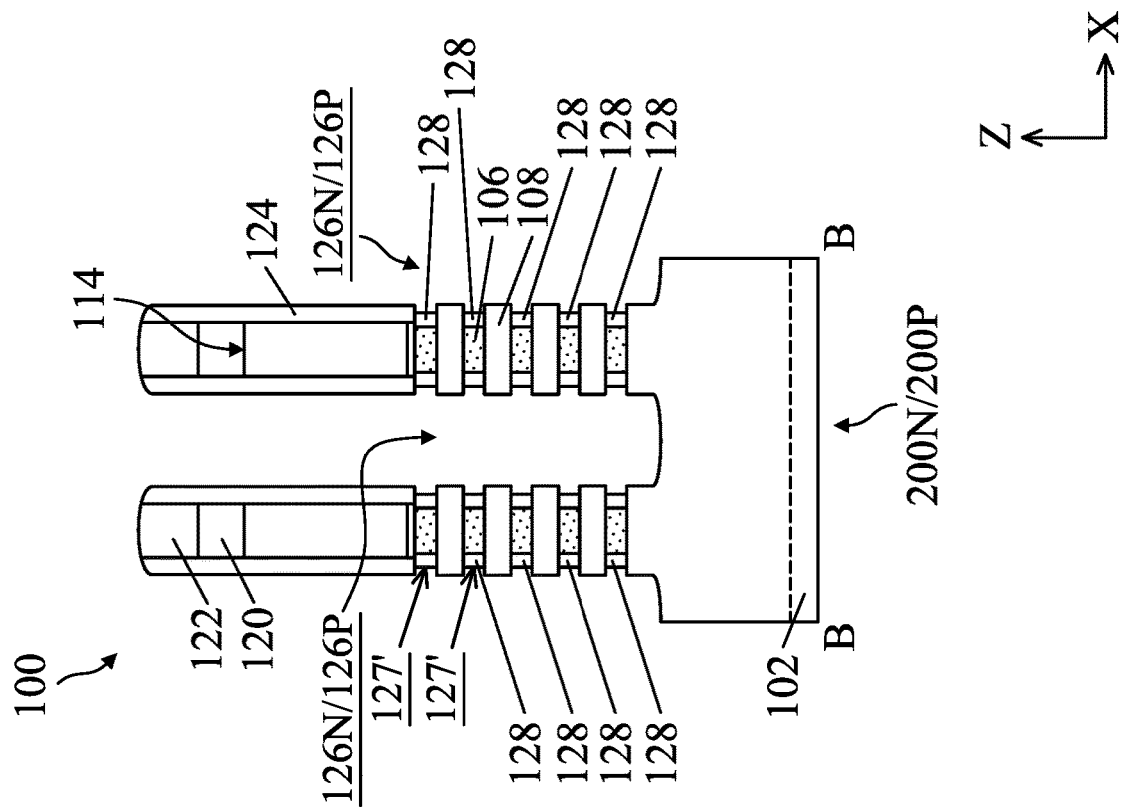
Figures 1, 2H:
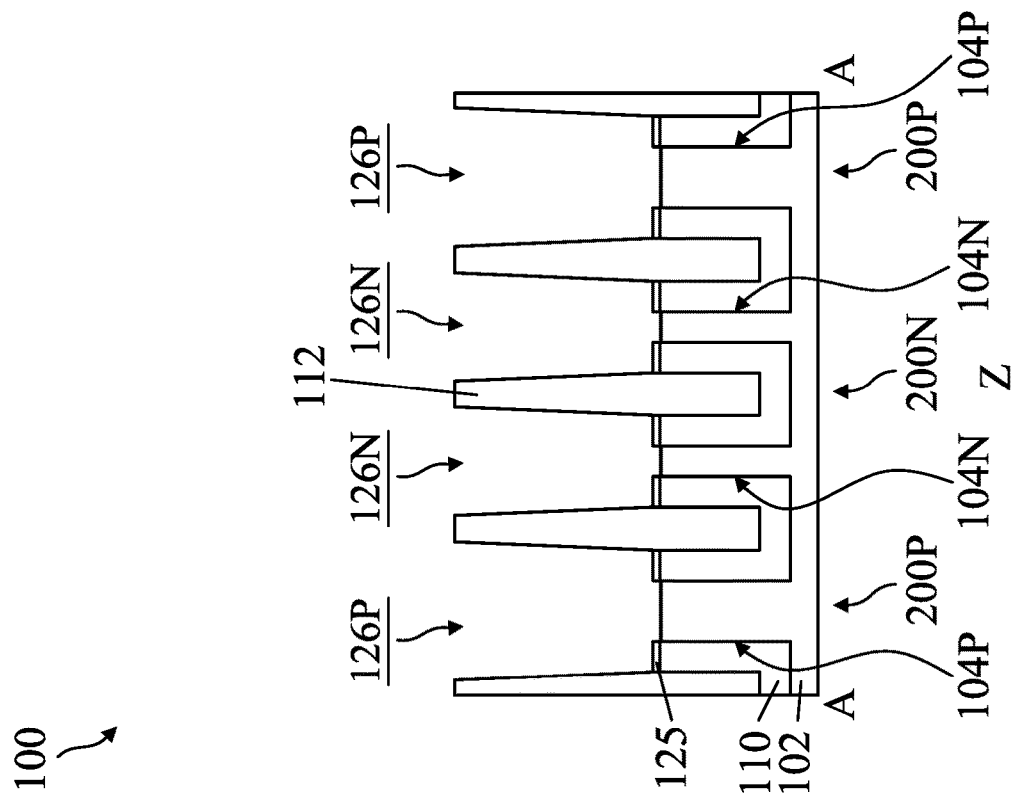

FIGS. 2H-1 and 2H-2 are cross-sectional views of a semiconductor structure 100 after the formation of inner spacer layers 128, in accordance with some embodiments of the disclosure. FIG. 2H-1 corresponds to cross-section A-A of FIG. 1 and FIG. 2H-2 corresponds to cross-section B-B of FIG. 1.

Inner spacer layers 128 are formed in the notches 127 to abut the side surfaces of the first semiconductor layers 106, as shown in FIG. 2H-2, in accordance with some embodiments. The inner spacer layers 128 interpose subsequently formed source/drain features and metal gate stack and are configured to reduce the parasitic capacitance between the metal gate stack and the source/drain features (i.e. Cgs and Cgd), in accordance with some embodiments. In some embodiments, the dimension of the inner spacer layers 128 measured in the X direction is in a range from about 3 nm to about 10 nm.

In some embodiments, the notches 127 are partially filled by the inner spacer layers 128. That is, the outer sidewalls of the inner spacer layers 128 faced away from the gate structures 114 are indented from the outer sidewalls of the gate spacer layers 124 faced away from the gate structures 114 and the side surfaces of the second semiconductor layers 108 toward the gate structures 114, in accordance with some embodiments. Remainders of the notches 127 are referred to as notches 127', in accordance with some embodiments. In addition, the inner sidewalls of the inner spacer layers 128 facing the gate structures 114 protrude from the inner sidewalls of the gate spacer layer 124 toward the gate structures 114, in accordance with some embodiments.

In some embodiments, the inner spacer layers 128 are made of a dielectric material, such as silicon oxycarbide (SiOC), silicon oxide carbonitride (SiOCN), silicon carbon nitride (SiCN), and/or a combination thereof, in accordance with some embodiments. In some embodiments, the inner spacer layers 128 are formed by globally depositing a dielectric material for the inner spacer layers 128 over the semiconductor structure 100 to fill the notches 127 and then etching back the dielectric material to remove the dielectric material outside the notches 127 to form the inner spacer layers 128. In some embodiments, the deposition process includes ALD, CVD (such as PECVD or LPCVD), another suitable technique, and/or a combination thereof. In some embodiments, the etching-back process includes a plasma dry etching, a dry chemical etching, and/or a wet etching. In some embodiments where the dielectric material for the inner spacer layers 128 entirely fills the notches 127, the etching-back process further laterally recessing the inner spacer layers 128 to form notches 127'.

FIGS. 2I-1 and 2I-2 are cross-sectional views of a semiconductor structure 100 after the formation of mask elements 130, in accordance with some embodiments of the disclosure. FIG. 2I-1 corresponds to cross-section A-A of FIG. 1 and FIG. 2I-2 corresponds to cross-section B-B of FIG. 1.

The mask elements 130 are formed to cover the PMOS regions 200P of the semiconductor structure 100 and expose the NMOS region 200N of the semiconductor structure 100, as shown in FIGS. 2I-1 and 2I-2, in accordance with some embodiments. In some embodiments, the mask elements 130 terminate at the upper surfaces of the dielectric fin structures 112. That is, an end of the mask element 130 is located at the upper surface of the dielectric fin structure 112, in accordance with some embodiments.

In some embodiments, the mask elements 130 are a patterned hard mask layer with openings exposing the NMOS region 200N. The hard mask layer may be made of silicon nitride (SiN), silicon oxynitride (SiON), silicon oxide (SiO$_2$), another suitable dielectric material, or a combination thereof. In some embodiments, the mask elements 130 are formed by conformally depositing a dielectric material for the mask elements 130 over the semiconductor structure 100, and then patterning the dielectric material to form the mask elements 130 over the PMOS regions 200P.

For example, a photoresist may be formed on the dielectric material, such as by using spin-on coating, and patterned with a pattern corresponding to the mask elements 130 by exposing the photoresist to light using an appropriate photomask. Exposed or unexposed portions of the photoresist may be removed depending on whether a positive or negative resist is used. The pattern of the photoresist may then be transferred to the dielectric material, such as by using one or more suitable etch processes and the NMOS region 200N of the semiconductor structure 100 is exposed. The photoresist can be removed in an ashing or wet strip process, for example.

FIGS. 2J-1 and 2J-2 are cross-sectional views of a semiconductor structure 100 after the formation of source/drain features 132, silicon layers 134 and silicon germanium layers 136, in accordance with some embodiments of the disclosure. FIG. 2J-1 corresponds to cross-section A-A of FIG. 1 and FIG. 2J-2 corresponds to cross-section B-B of FIG. 1.

Source/drain features 132 are formed in the source/drain recesses 126N at NMOS region 200N of the semiconductor structure 100 using an epitaxial growth process, as shown in FIGS. 2J-1 and 2J-2, in accordance with some embodiments. The epitaxial growth process may be MBE, MOCVD, or VPE, another suitable technique, or a combination thereof. The source/drain features 132 are grown on the source/drain regions SD of the fin structures 104N, in accordance with some embodiments. The source/drain features 132 abut the second semiconductor layers 108 of the fin structures 104N and fill the notches 127' to abut the inner spacer layers 128, as shown in FIG. 2J-2, in accordance with some embodiments.

In some embodiments, the source/drain features 132 are made of semiconductor material such as SiP, SiCP, SiC, Si, GaAs, another suitable semiconductor material, or a combination thereof. In some embodiments, the source/drain features 132 are N-type epitaxial layers. For example, the source/drain features 132 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features.

The semiconductor material for the source/drain features 132 is grown from the semiconductor surface of the fin structures 104N, in accordance with some embodiments. The mask elements 130 are configured to prevent the semiconductor material from being grown in the source/drain recesses 126P at the PMOS region 200P during the epitaxial growth process, in accordance with some embodiments. The source/drain features 132 are grown to substantially cover the entire side surfaces of the uppermost second semiconductor layers 108 of the fin structures 104N, as shown in FIG. 2J-2, in accordance with some embodiments. That is, in some embodiments, the source/drain features 132 are formed with upper surfaces substantially level to or higher than the upper surfaces of the uppermost second semiconductor layers 108, in accordance with some embodiments. In some embodiments, the height of source/drain features 132 (measured in the Z direction) is in a range from about 30 nm to about 100 nm.

Furthermore, the source/drain features 132 may be epitaxially grown to have faceted surfaces that have specific crystalline orientations. Because the growth of the source/drain features 132 are confined by the dielectric fin structures 112, the source/drain features 132 are formed to have surfaces that conform to and are interfaced with sidewalls of the dielectric fin structures 112, as shown in FIG. 2J-1, in accordance with some embodiments. In some embodiments, the width of source/drain features 132 measured in the Y direction is in a range from about 10 nm to about 50 nm.

After the source/drain features 132 are formed, silicon layers 134 are formed over the source/drain features 132 and silicon germanium layers 136 are formed over the silicon layer 134 using an epitaxial growth process, as shown in FIGS. 2J-1 and 2J-2, in accordance with some embodiments. The silicon layers 134 and the silicon germanium layers 136 are formed along the upper surfaces of the source/drain features 132 and contact the dielectric fin structures 112, as shown in FIG. 2J-1, in accordance with some embodiments. Furthermore, the silicon layers 134 and the silicon germanium layers 136 extend into the uppermost notches 127' and are in contact with the uppermost inner spacer layers 128, as shown in FIG. 2J-2, in accordance with some embodiments.

In some embodiments, the source/drain features 132, the silicon layers 134 and the silicon germanium layers 136 are epitaxially grown in situ. That is, in some embodiments, the epitaxial growth steps of the source/drain features 132, the silicon layer 134 and the silicon germanium layer 136 are continuously performed in a single process tool so that the silicon layers 134 and the silicon germanium layers 136 are formed self-aligned to the source/drain features 132 In some embodiments, the thickness of the silicon layers 134 is in a range from about 1 nm to about 3 nm. In some embodiments, the thickness of the silicon germanium layers 136 is in a range from about 2 nm to about 6 nm. In some embodiments, the concentration of germanium from the silicon germanium layer 136 is in a range from about 20 atomic % to about 75 atomic %.

Figures 1, 2, 2K:
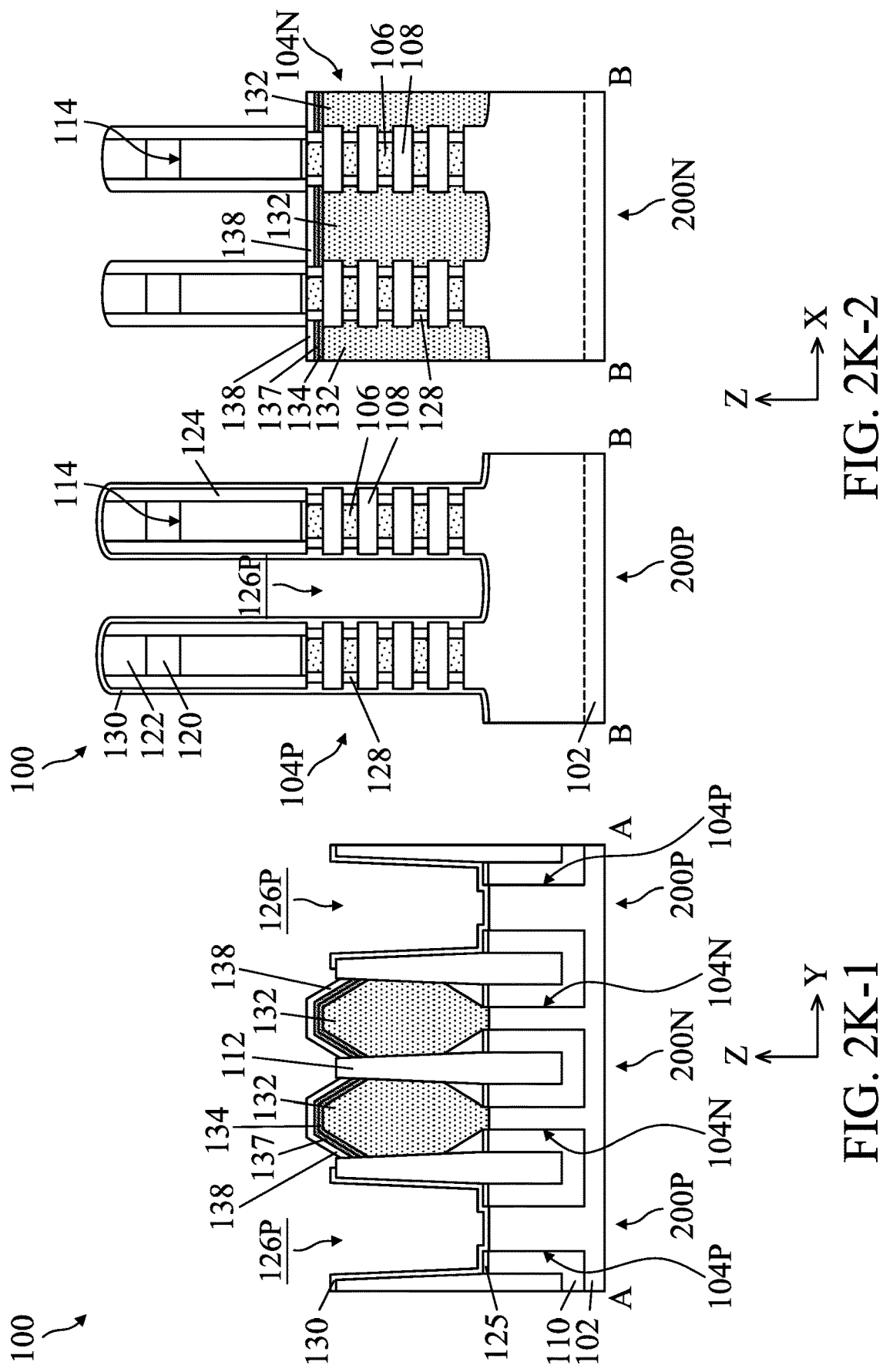

FIGS. 2K-1 and 2K-2 are cross-sectional views of a semiconductor structure 100 after the oxidation of silicon germanium layers 136, in accordance with some embodiments of the disclosure. FIG. 2K-1 corresponds to cross-section A-A of FIG. 1 and FIG. 2K-2 corresponds to cross-section B-B of FIG. 1.

An oxidation process is performed on the semiconductor structure 100, in accordance with some embodiments. The silicon germanium layers 136 are oxidized to form germanium piled-up layers 137 and silicon oxide layers 138 over the germanium piled-up layers 137, as shown in FIG. 2K-1 and FIG. 2K-2, in accordance with some embodiments. The silicon oxide layers 138 are self-aligned over the source/drain features 132, in accordance with some embodiments.

The oxidation process may be performed in ambient containing oxygen such as water vapor, steam, $O_2$ and/or a mixture of $H_2O$ and $H_2$, and at a temperature of about 350° C. to about 650° C. Because the germanium atoms have lower energy at the interface between the oxide layer (e.g., SiO) and the semiconductor layer (e.g., Si), the germanium atoms from the silicon germanium layers 136 move toward the silicon layer 134 to form the germanium piled-up layers 137 while an outer portion of the silicon germanium layers 136 exposed to the ambient containing oxygen is oxidized to form the silicon oxide layers 138, in accordance with some embodiments. As a result, the germanium atoms from the silicon germanium layers 136 pile up between the silicon layer 134 and the silicon oxide layers 138, in accordance with some embodiments.

In some embodiments, the germanium piled-up layers 137 are silicon germanium having a higher germanium concentration than silicon germanium layer 136. For example, the concentration of germanium from the silicon germanium layer 136 is in a range from about 15 atomic % to about 50 atomic %. In some embodiments, the thickness of the germanium piled-up layers 137 is in a range from about 1 nm to about 3 nm. In some embodiments, the thickness of the silicon oxide layers 138 is in a range from about 1 nm to about 4 nm.

The silicon layers 134 are configured as a barrier layer between the source/drain features 132 and the silicon germanium layers 136 (or the germanium piled-up layer 137). In some embodiments, the silicon layers 134 are partially consumed by providing silicon atoms which may diffuse through the germanium piled-up layers 137 and be oxidized to form a portion of the silicon oxide layers 138. As a result, the thickness of the as-deposited silicon layers 134 may be selected based on the process window of the oxidation process. In some embodiments, the thickness of the silicon layers 134 after the oxidation process is less than about 2 nm.

Figures 1, 2, 2L:
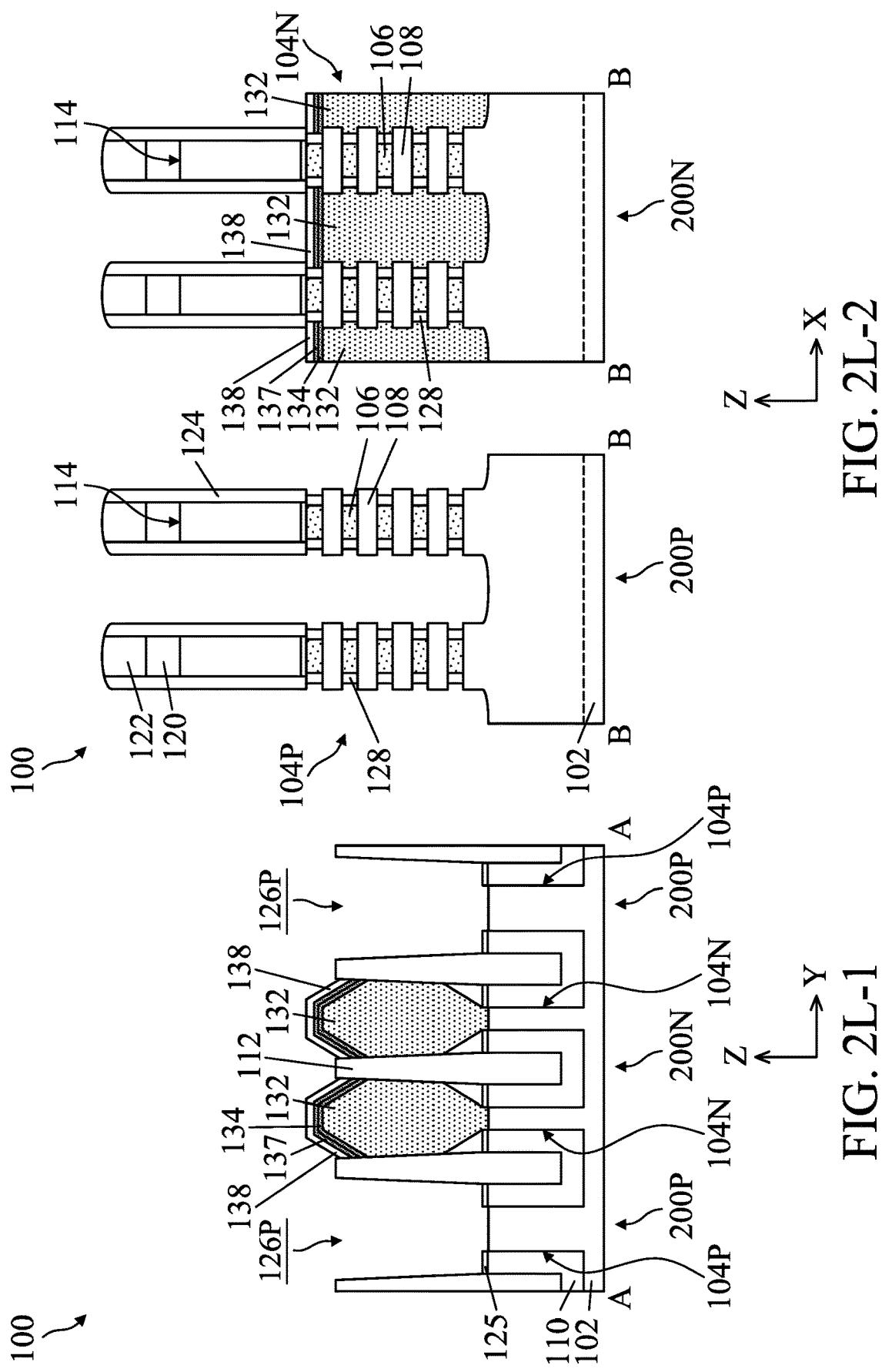

FIGS. 2L-1 and 2L-2 are cross-sectional views of a semiconductor structure 100 after the removal of mask elements 130, in accordance with some embodiments of the disclosure. FIG. 2L-1 corresponds to cross-section A-A of FIG. 1 and FIG. 2L-2 corresponds to cross-section B-B of FIG. 1.

The mask elements 130 are removed using etching process such as dry etching, wet etching, or a combination thereof, as shown in FIGS. 2L-1 and 2L-2, in accordance with some embodiments. After the removal process, the source/drain regions SD of the fin structures 104P are exposed, in accordance with some embodiments.

FIGS. 2M-1 and 2M-2 are cross-sectional views of a semiconductor structure 100 after the formation of source/drain features 142, in accordance with some embodiments of the disclosure. FIG. 2M-1 corresponds to cross-section A-A of FIG. 1 and FIG. 2M-2 corresponds to cross-section B-B of FIG. 1.

Source/drain features 142 are formed in the source/drain recesses 126P at the PMOS region 200P of the semiconductor structure 100 using an epitaxial growth process, as shown in FIGS. 2M-1 and 2M-2, in accordance with some embodiments. The epitaxial growth process may be MBE, MOCVD, or VPE, another suitable technique, or a combination thereof. The source/drain features 142 are grown on the source/drain regions SD of the fin structures 104P, in accordance with some embodiments. The source/drain features 142 abut the second semiconductor layers 108 of the fin structures 104P and fill the notches 127' to abut the inner spacer layers 128, as shown in FIG. 2M-2, in accordance with some embodiments.

In some embodiments, the source/drain features 142 are made of semiconductor material such as SiGe, Si, GaAs, another suitable semiconductor material, or a combination thereof. In some embodiments, the source/drain features 142 are P-type epitaxial layers.

The silicon oxide layers 138 are configured as mask elements to prevent the semiconductor material from being grown over the fin structures 104N in the NMOS region 200N during the epitaxial growth process of source/drain features 142, in accordance with some embodiments. Because the silicon oxide layers 138 are formed by oxidizing the silicon germanium layer 136 without using a photolithography process, the silicon oxide layers 138 self-aligned to the source/drain features 132 are referred to as self-aligned mask elements.

The semiconductor material for the source/drain features 142 is grown on the semiconductor surface of the fin structures 104P, in accordance with some embodiments. The source/drain features 142 are grown to substantially cover the entire side surfaces of the uppermost second semiconductor layers 108 of the fin structures 104P, as shown in FIG. 2M-2, in accordance with some embodiments. That is, in some embodiments, the source/drain features 142 are formed with upper surfaces substantially level to or higher than the upper surfaces of the uppermost second semiconductor layers 108, in accordance with some embodiments. In some embodiments, the height of source/drain features 142 (measured in the Z direction) is in a range from about 30 nm to about 100 nm.

Furthermore, the source/drain features 142 may be epitaxially grown to have facet surfaces that have specific crystalline orientations. Because the growth of the source/drain features 142 are confined by the dielectric fin structures 112, the source/drain features 142 are formed to have surfaces that conform to and are interfaced with sidewalls of the dielectric fin structures 112, as shown in FIG. 2M-1, in accordance with some embodiments. In some embodiments, the width of source/drain features 142 measured in the Y direction is in a range from about 10 nm to about 50 nm. After the source/drain features 142 are formed, the silicon oxide layers 138 may be optionally removed to expose the germanium piled-up layers 137.

As the scale of semiconductor devices continues to shrink, one of the design challenges of the semiconductor devices is to improve photolithography process window, e.g., critical dimension uniformity (CDU) and/or overlay accuracy. In an instance, a mask element is formed to cover an N-type source/drain feature using a photolithography process to form a photoresist pattern on a mask layer and an etching process to define the mask elements. If CD of the photoresist pattern is too small, the N-type source/drain feature may be damaged during the etching process. If CD of the photoresist pattern is too large, the subsequently formed P-type source/drain feature may have with a small size.

The embodiments of the present disclosure employ the self-aligned mask element 138 to form the P-type source/drain feature 142, and therefore no photolithography process is required. As a result, the manufacturing processes may be simplified and the risk of CD/overlay shift may be avoided. Therefore, the yield and the performance of the resulting semiconductor device may be improved.

Figures 1, 2, 2N:
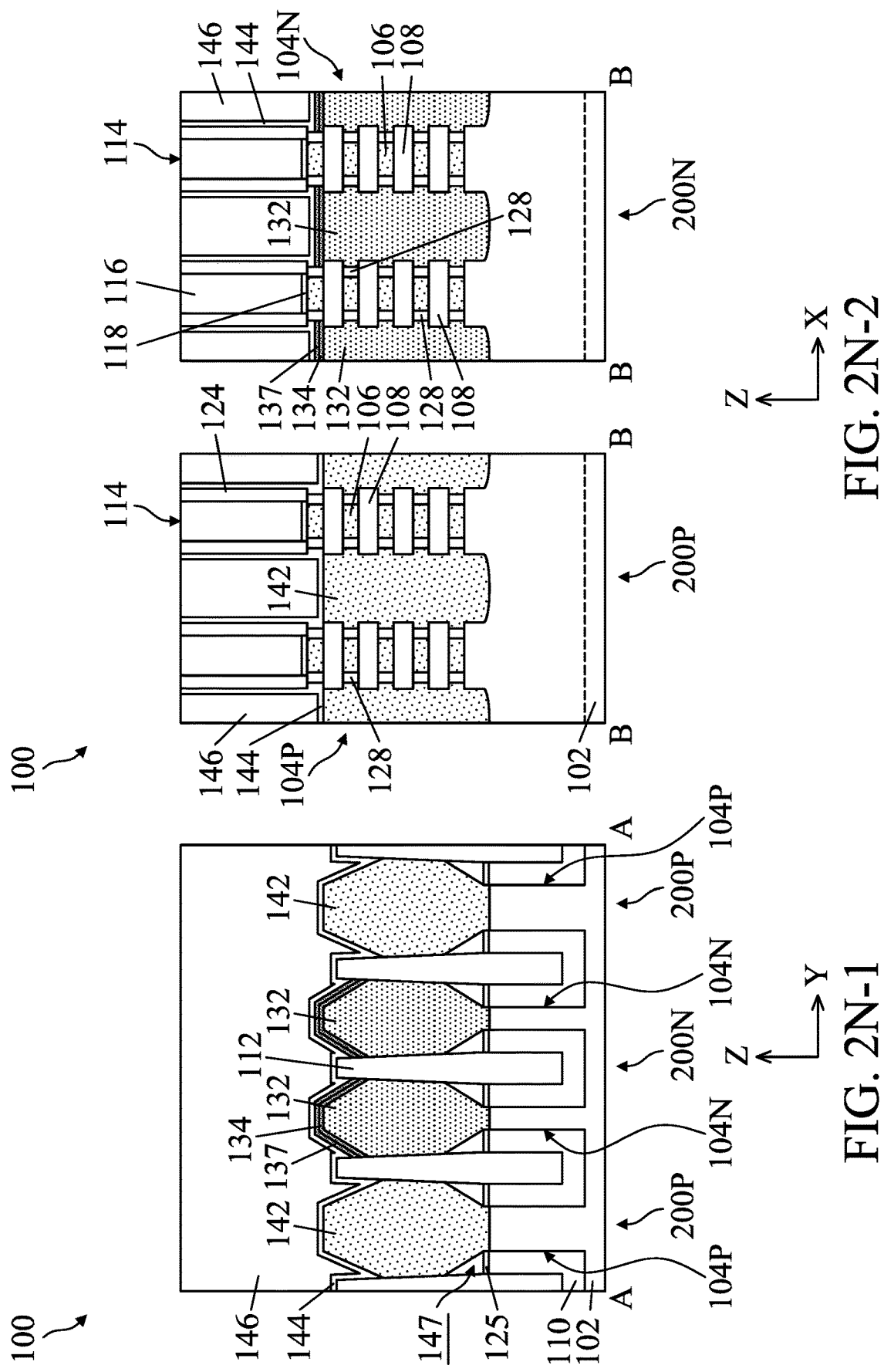
Figures 1, 2, 20:
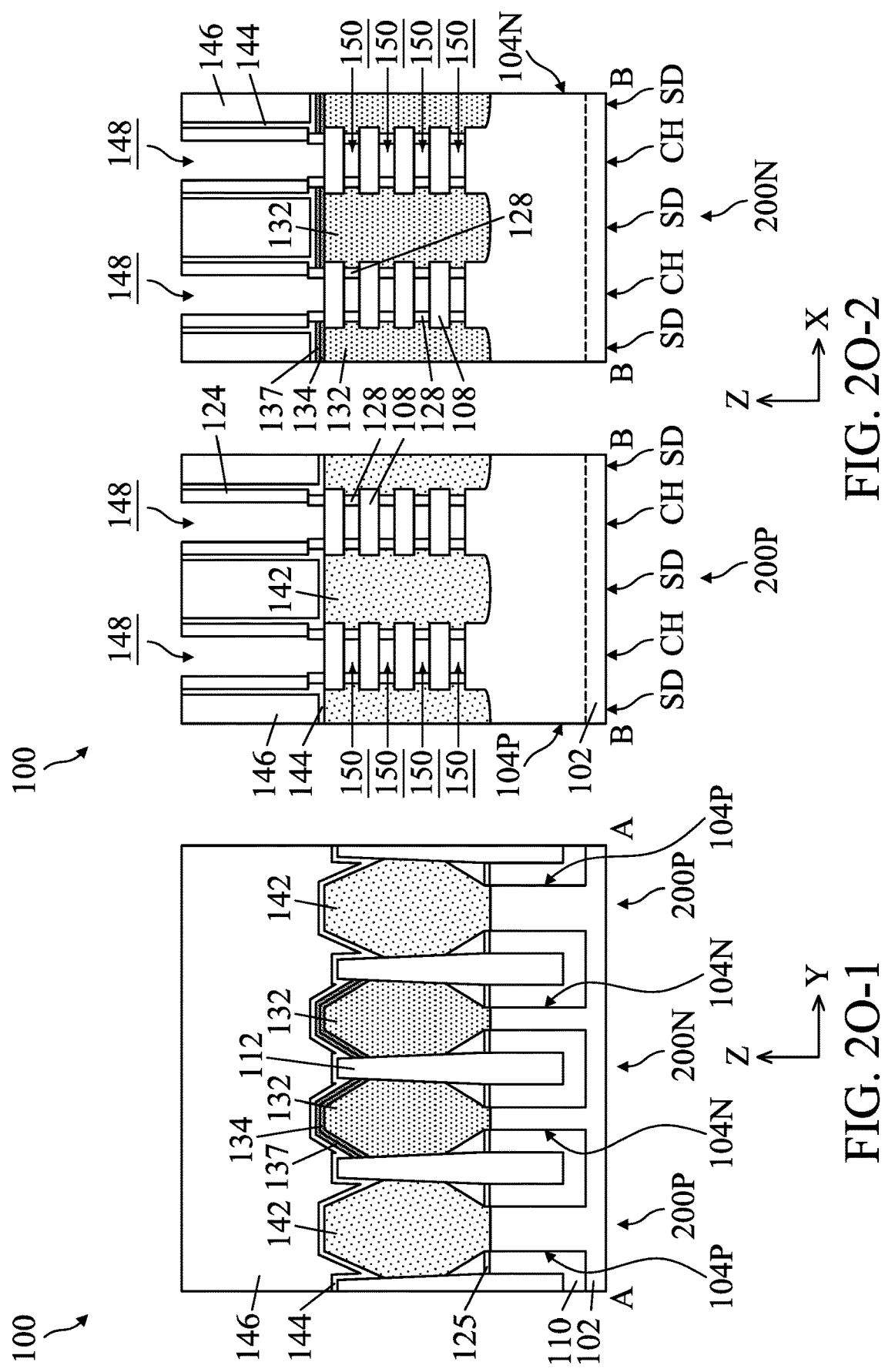

FIGS. 2N-1 and 2N-2 are cross-sectional views of a semiconductor structure 100 after the formation of contact etching stop layer (CESL) 144 and interlayer dielectric (ILD) layer 146, in accordance with some embodiments of the disclosure. FIG. 2N-1 corresponds to cross-section A-A of FIG. 1 and FIG. 2N-2 corresponds to cross-section B-B of FIG. 1.

A contact etching stop layer 144 is conformally formed over the semiconductor structure 100, as shown in FIGS. 2N-1 and 2N-1, in accordance with some embodiments. The contact etching stop layer 144 extends along and covers the upper surfaces of the source/drain features 142, the sidewalls and upper surfaces of the dielectric fin structures 112, the upper surfaces of the germanium piled-up layers 137, as shown in FIG. 2N-1, in accordance with some embodiments. The contact etching stop layer 144 also extends along and covers the sidewalls of the gate spacer layers 124, as shown in FIG. 2N-2, in accordance with some embodiments. In some embodiments, the contact etching stop layer 144 fills the uppermost recesses 127' to contact the uppermost inner spacer layers 128. Afterward, an interlayer dielectric layer 146 is formed over the contact etching stop layer 144, as shown in FIGS. 2N-1 and 2N-2, in accordance with some embodiments.

In some embodiments, the contact etching stop layer 144 is made of a dielectric material, such as silicon oxide ($SiO_2$), silicon nitride (SiN), oxygen-doped silicon carbide (SiC:O), oxygen-doped silicon carbon nitride (SiCN:O), or a combination thereof. In some embodiments, a dielectric material for the contact etching stop layer 144 is globally deposited over the semiconductor structure 100 using CVD (such as LPCVD, PECVD, HDP-CVD, HARP, and FCVD), ALD, another suitable method, or a combination thereof.

In some embodiments, the interlayer dielectric layer 146 is made of a dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, a dielectric material for the interlayer dielectric layer 146 is deposited using such as CVD (such as HDP-CVD, PECVD, or HARP), another suitable technique, and/or a combination thereof. Afterward, the dielectric materials for the contact etching stop layer 144 and the interlayer dielectric layer 146 above the upper surfaces of the dummy gate electrode layers 124 are removed using such as CMP until the upper surfaces of the dummy gate structures 114 are exposed. During the planarization process, the etching masks 120 and 122 may be also removed. In some embodiments, the upper surface of the interlayer dielectric layer 146 is substantially coplanar with the upper surfaces of the dummy gate electrode layers 116.

In some embodiments, the dielectric materials for the contact etching stop layer 144 and the interlayer dielectric layer 146 are not filled into a space between the source/drain feature 132/142, the dielectric fin structure 112, and the isolation structure 110 (or the fin spacer layers 125) thereby forming air gaps 147, as shown in FIG. 2N-1.

Figures 2, 2O, 3:
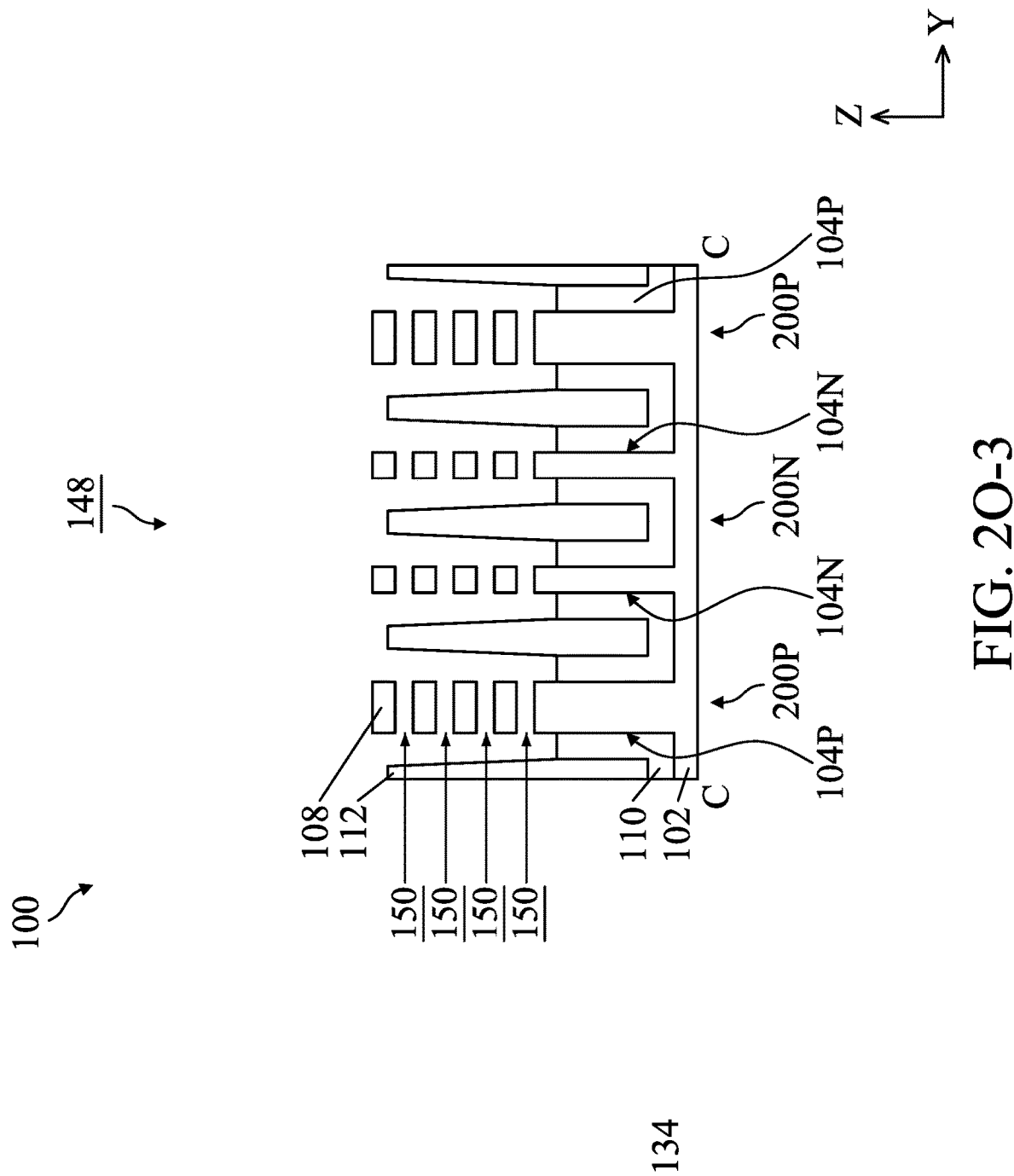

FIGS. 2O-1, 2O-2 and 2O-3 are cross-sectional views of a semiconductor structure 100 after the formation of gate trenches 148 and gaps 150, in accordance with some embodiments of the disclosure. FIG. 2O-1 corresponds to cross-section A-A of FIG. 1; FIG. 2O-2 corresponds to cross-section B-B of FIG. 1; and FIG. 2O-3 corresponds to cross-section C-C of FIG. 1.

The dummy gate structures 114 are removed using an etching process to form gate trenches 148, as shown in FIGS. 2O-2 and 2O-3, in accordance with some embodiments. The gate trenches 148 expose the channel regions CH of the fin structures 104N and 104P, in accordance with some embodiments. In some embodiments, the gate trenches 148 also expose the inner sidewalls of the gate spacer layers 124 facing the channel region CH, as shown in FIG. 2O-2, in accordance with some embodiments.

In some embodiments, the etching process includes one or more etching processes. For example, when the dummy gate electrode layers 116 are made of polysilicon, a wet etchant such as a tetramethylammonium hydroxide (TMAH) solution may be used to selectively remove the dummy gate electrode layers 116. For example, the dummy gate dielectric layers 118 may be thereafter removed using a plasma dry etching, a dry chemical etching, and/or a wet etching.

The first semiconductor layers 106 of the fin structures 104N and 104P are removed using an etching process to form gaps 150, as shown in FIGS. 2O-2 and 2O-3, in accordance with some embodiments. The gaps 150 are formed between the neighboring second semiconductor layers 108 and between the lowermost second semiconductor layer 108 and the lower portion of the fin structures 104N/104P, in accordance with some embodiments. In some embodiments, the gaps 150 also expose the inner sidewalls of the inner spacer layers 128 facing the channel region CH, as shown in FIG. 2O-2.

After the etching process, the four main surfaces of the second semiconductor layers 108 are exposed, as shown in FIG. 2O-3, in accordance with some embodiments. The exposed second semiconductor layers 108 form nanostructures that function as channel layers of the resulting semiconductor devices (e.g., gate-all-around transistors), in accordance with some embodiments.

In some embodiments, the etching process includes a selective wet etching process, such as APM (e.g., ammonia hydroxide-hydrogen peroxide-water mixture) etching process. In some embodiments, the wet etching process uses etchants such as ammonium hydroxide ($NH_4OH$), TMAH, ethylenediamine pyrocatechol (EDP), and/or potassium hydroxide (KOH) solutions. In some embodiments, the inner spacer layers 128 serve an etching stop layer in the etching process.

Figures 1, 2, 2P:
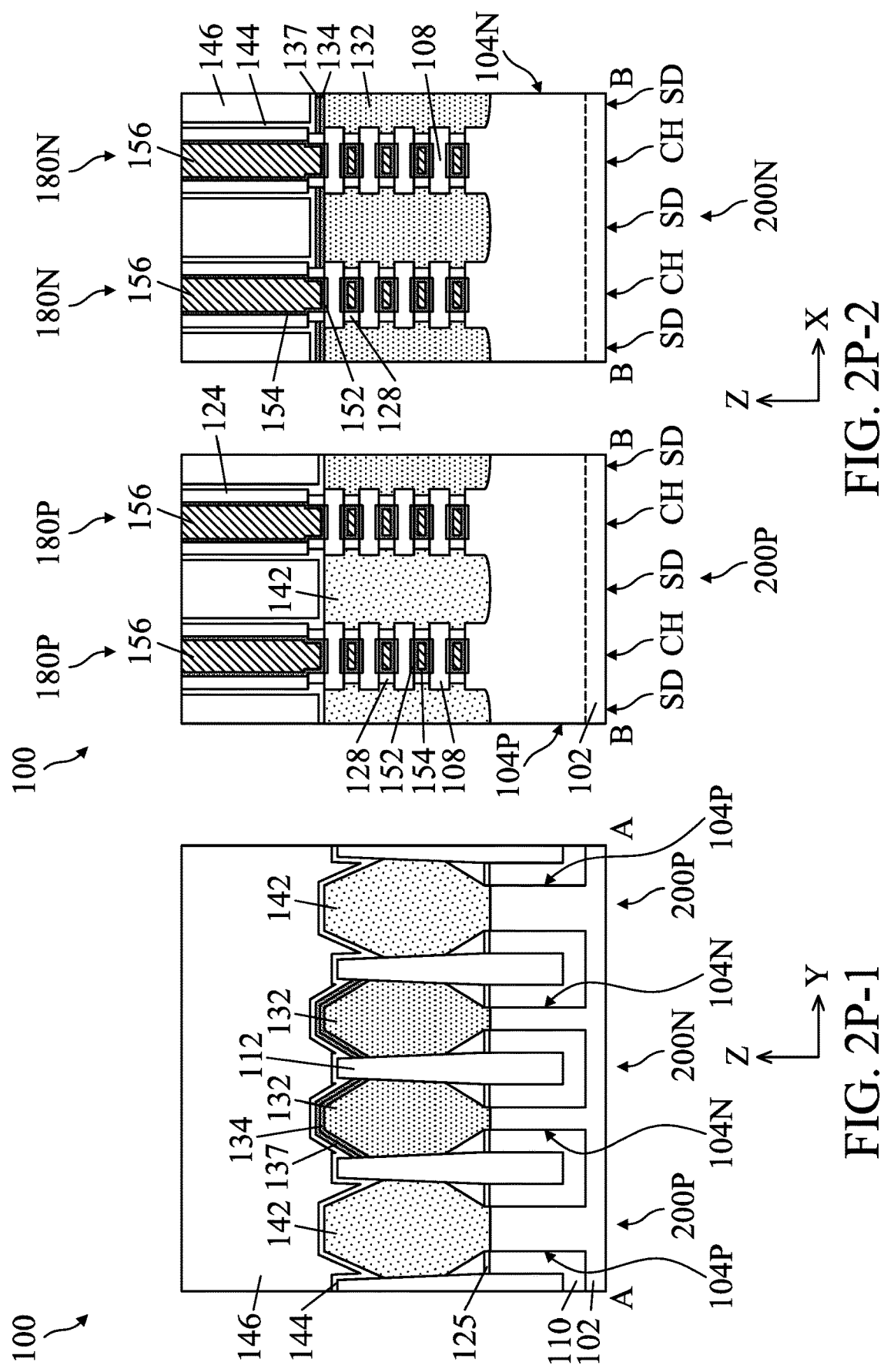
Figures 2, 2P, 3:
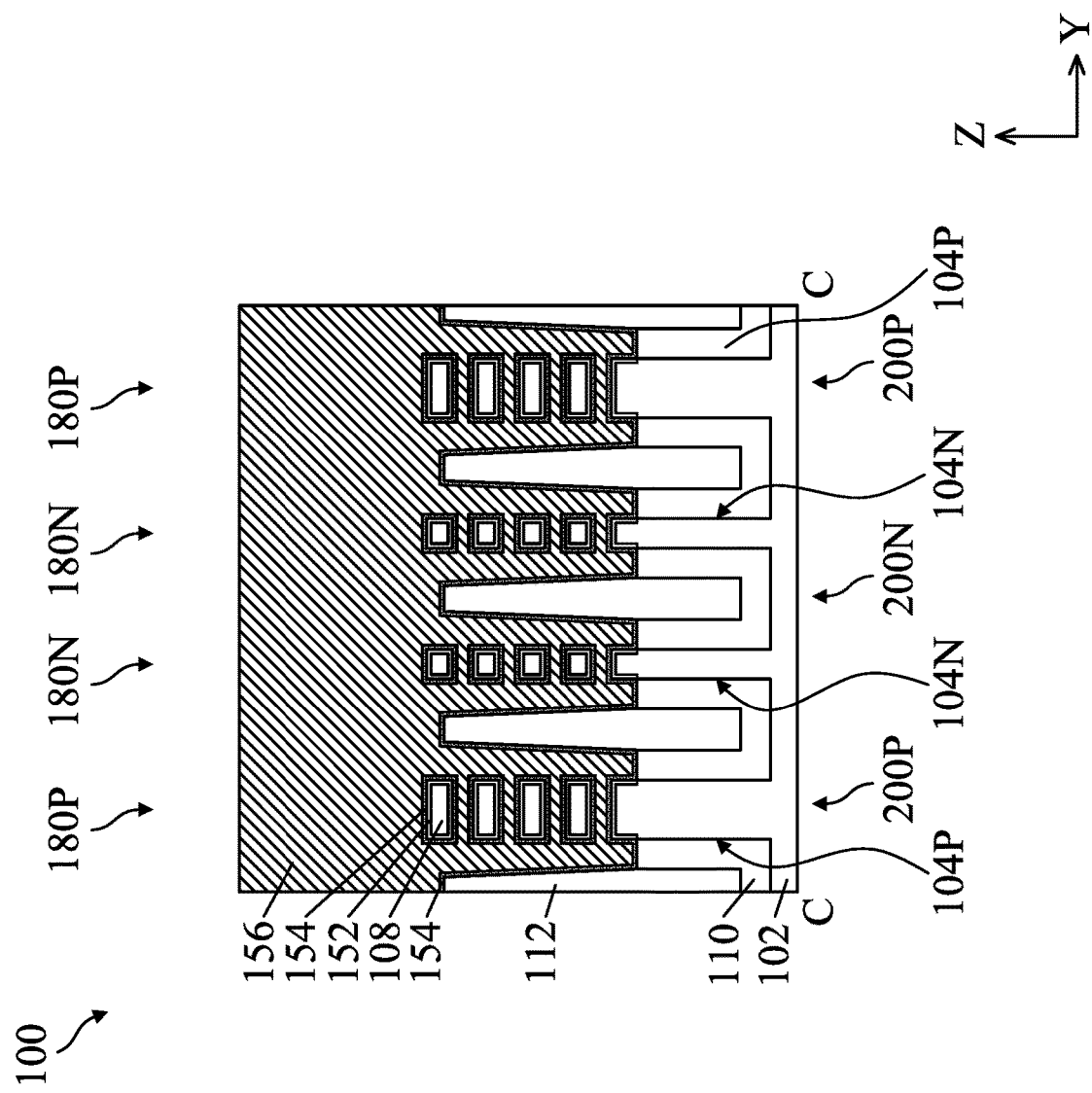

FIGS. 2P-1, 2P-2 and 2P-3 are cross-sectional views of a semiconductor structure 100 after the formation of final gate stacks, in accordance with some embodiments of the disclosure. FIG. 2P-1 corresponds to cross-section A-A of FIG. 1; FIG. 2P-2 corresponds to cross-section B-B of FIG. 1; and FIG. 2P-3 corresponds to cross-section C-C of FIG. 1.

Interfacial layers 152 are formed on the exposed main surfaces of the second semiconductor layers 108 to wrap around respective second semiconductor layers 108, as shown in FIGS. 2P-2 and 2P-3, in accordance with some embodiments. The interfacial layers 152 are also formed on the exposed upper surfaces and sidewalls of the lower portions of the fin structures 104N and 104P, as shown in FIG. 2P-3, in accordance with some embodiments. In some embodiments, the thickness of the interfacial layer 152 is in a range from about 5 angstrom (Å) to about 15 Å.

In some embodiments, the interfacial layers 152 are made of a chemically formed silicon oxide. In some embodiments, the interfacial layers 152 are formed using one or more cleaning processes such as including ozone ($O_3$), ammonia hydroxide-hydrogen peroxide-water mixture, and/or hydrochloric acid-hydrogen peroxide-water mixture. Therefore, portions of semiconductor material from the second semiconductor layers 108 and the substrate 102 are oxidized to form the interfacial layers 152, in accordance with some embodiments.

High-k gate dielectric layers 154 are formed conformally along the interfacial layer 152 to wrap around respective second semiconductor layers 108, as shown in FIGS. 2P-2 and 2P-3, in accordance with some embodiments. The high-k gate dielectric layers 154 are also conformally formed along the inner sidewalls of the inner spacer layers 128 and the inner sidewalls of the gate spacer layers 124, as shown in FIG. 2P-2, in accordance with some embodiments. The high-k gate dielectric layers 154 partially cover the upper surfaces of the uppermost inner spacer layers 128, as shown in FIG. 2P-2, in accordance with some embodiments.

The high-k gate dielectric layers 154 are also conformally the upper surfaces and the sidewalls of the dielectric fin structures 112, the upper surfaces of the isolation structure 110, as shown in FIG. 2P-3, in accordance with some embodiments. In some embodiments, the thickness of the high-k gate dielectric layers 154 is in a range from about 10 Å to about 20 Å.

In some embodiments, the high-k gate dielectric layers 154 are made of a dielectric material with high dielectric constant (k value), for example, greater than 3.9. In some embodiments, the high-K dielectric material includes hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), a combination thereof, or another suitable material. The high-K gate dielectric layer 154 may be formed by ALD, PVD, CVD, and/or another suitable technique.

The metal gate electrode layers 156 are formed over the high-k gate dielectric layers 154 and fill the remainders of the gaps 150 and the gate trenches 148, as shown in FIGS. 2P-2 and 2P-3, in accordance with some embodiments. The metal gate electrode layers 156 wrap around the second semiconductor layers 108, as shown in FIG. 2P-3, in accordance with some embodiments.

In some embodiments, the metal gate electrode layers 156 are made of more than one conductive material, such as a metal, metal alloy, conductive metal oxide and/or metal nitride, another suitable conductive material, and/or a combination thereof. The metal gate electrode layers 156 may be a multi-layer structure with various combinations of a diffusion barrier layer, a work function layer with a selected work function to enhance the device performance (e.g., threshold voltage) for n-channel transistor and p-channel transistor, a capping layer to prevent oxidation of a work function layer, a glue layer to adhere the work function layer to next layer, and a metal fill layer to reduce the resistance of the gate stack, and/or another suitable layer.

The metal gate electrode layers 156 may be made of doped polysilicon, doped poly-germanium, Ti, Ag, Al, TiAlN, TaC, TaCN, TaSiN, Mn, Zr, TiN, TaN, Ru, Mo, Al, WN, Cu, W, Re, Ir, Co, Ni, another suitable conductive material, or multilayers thereof. The gate electrode layer may be formed by ALD, PVD, CVD, e-beam evaporation, or another suitable process. Furthermore, the metal gate electrode layers 156 may be formed separately for N-FET and P-FET transistors which may use different gate electrode materials and/or different work function materials.

A planarization process such as CMP may be performed on the semiconductor structure 100 to remove the materials of the high-k dielectric layers 154 and the metal gate electrode layers 156 formed above the upper surface of the interlayer dielectric layer 146, in accordance with some embodiments.

The interfacial layers 152, the high-k dielectric layers 154 and the metal gate electrode layers 156 combine to form final gate stacks for respective transistors. The final gate stacks wrap around and extend across the nanostructures of the second semiconductor layers 108, in accordance with some embodiments. The final gate stacks may engage the channel region (i.e., the nanostructures of the second semiconductor layers 108) of the transistors, such that current can flow between the source/drain features 132 and between the source/drain features 142 during operation. In some embodiments, the final gate stacks extend in the Y direction. That is, the final gate stacks have longitudinal axes parallel to the Y direction, in accordance with some embodiments. In some embodiments, the final gate stacks are arranged in the X direction. In some embodiments, the final gate stacks extend across the dielectric fin structures 112, as shown in FIG. 2P-3.

In the PMOS region 200P, the final gate stacks interpose and combine with the source/drain features 142 to form P-type semiconductor devices, e.g., P-channel gate-all-around FETs 180P, in accordance with some embodiments. In the NMOS region 200N, the final gate stacks interpose and combine with the source/drain features 132 to form N-type semiconductor devices, e.g., N-channel gate-all-around FETs 180N, in accordance with some embodiments.

After the final gate stacks are formed, a cutting process may be performed on the final gate stacks to separate one final gate stacks into several sub-gate stacks. The cutting process may include etching the final gate stacks to form gate-cut openings. For example, a gate-cut opening may correspond to a cross point of the final gate stack and the dielectric fin structure 112 and extend through the final gate stack to expose dielectric fin structure 112. One or more dielectric materials are then deposited in the gate-cut openings to form gate-cut features. The configurations of the gate-cut features and the sub-gate stack may be dependent on applications of the semiconductor structure 100 and design demands of integrated circuits.

Figures 1, 2, 2Q:
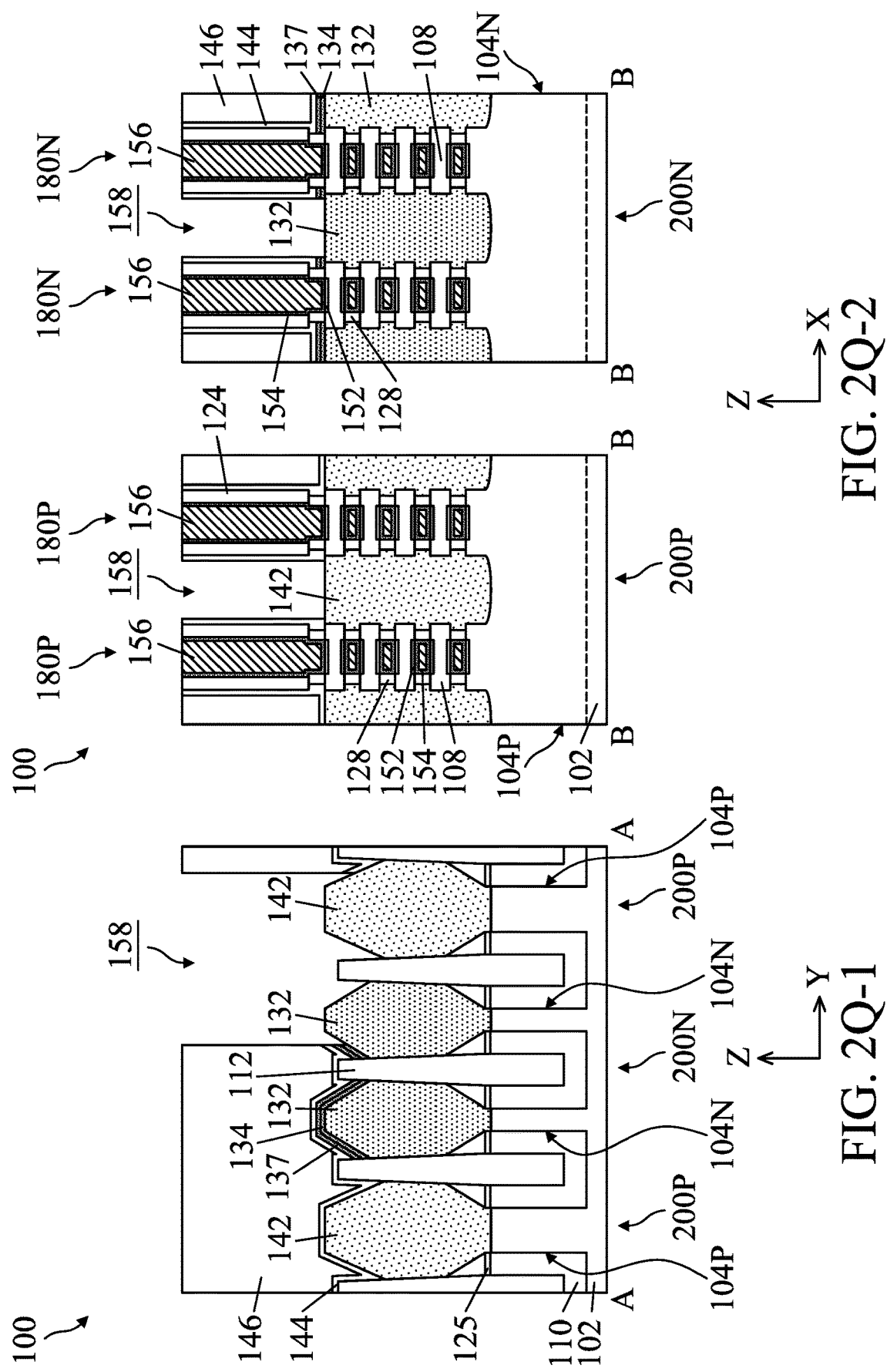

FIGS. 2Q-1 and 2Q-2 are cross-sectional views of a semiconductor structure 100 after the formation of a contact opening 158, in accordance with some embodiments of the disclosure. FIG. 2Q-1 corresponds to cross-section A-A of FIG. 1 and FIG. 2Q-2 corresponds to cross-section B-B of FIG. 1.

A contact opening 158 is formed through the interlayer dielectric layer 146, the contact etching stop layer 144, the germanium piled-up layer 137 and the silicon layer 134, as shown in FIGS. 2Q-1 and 2Q-2, in accordance with some embodiments. The contact opening 158 exposes the source/drain feature 132, the dielectric fin structures 112, and the source/drain feature 142, as shown in FIG. 2Q-1, in accordance with some embodiments. In some embodiments, the contact opening 158 also exposes the contact etching stop layer 144 formed along the gate spacer layer 124, as shown in FIG. 2Q-2.

In some embodiments, the contact opening 158 is formed using a patterning process. The patterning process may include forming a patterned mask layer (e.g., patterned photoresist layer and/or patterned hard mask layer) over the upper surfaces of the interlayer dielectric layer 146 and the final gate stacks. The patterned mask layer may have an opening pattern corresponding to the contact opening 158. Portions of the interlayer dielectric layer 146, the contact etching stop layer 144, the germanium piled-up layer 137 and the silicon layer 134 uncovered by the patterned mask layer are etched away, in accordance with some embodiments.

Figures 1, 2, 2R:
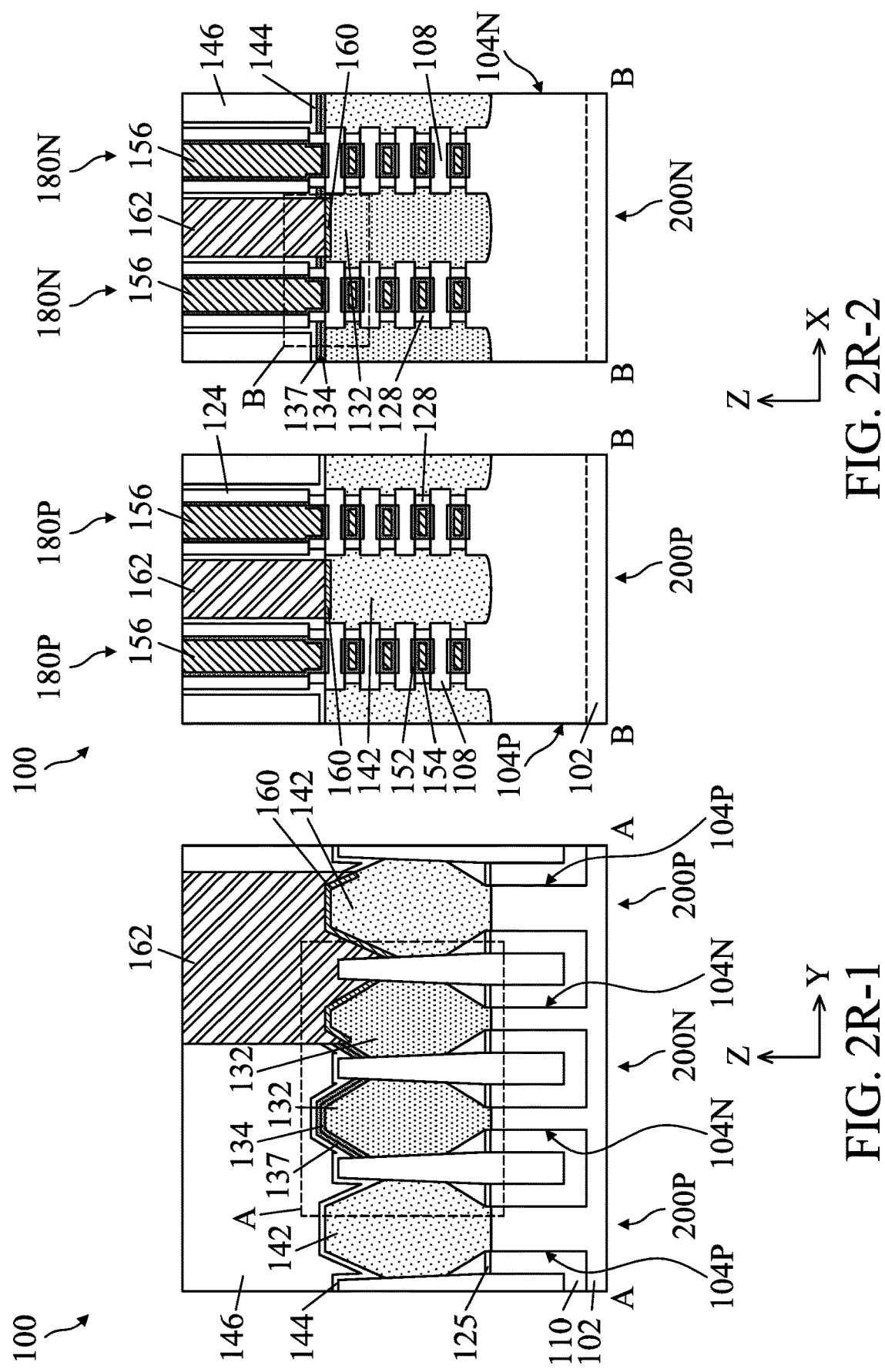
Figures 1, 2, 3:
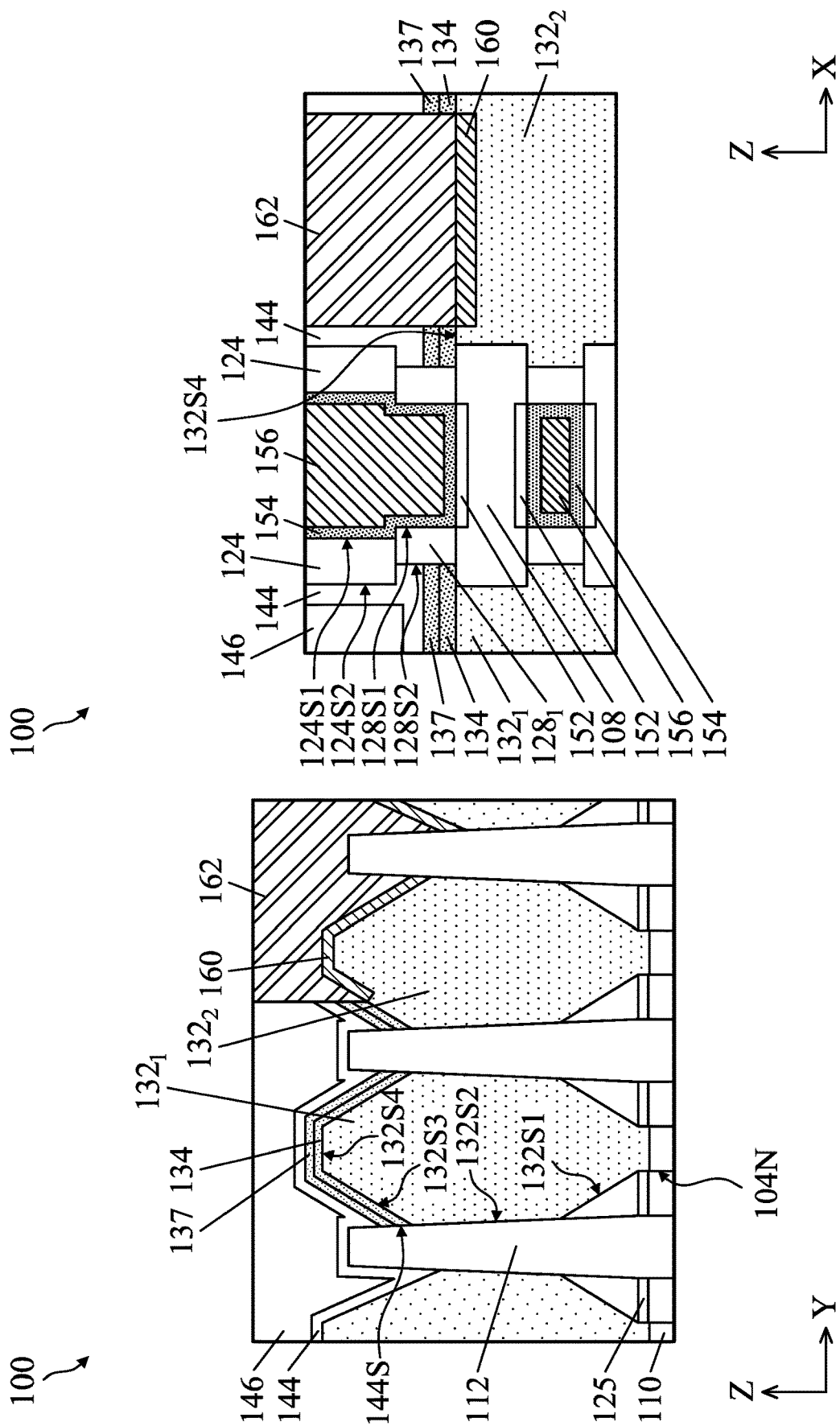

FIGS. 2R-1 and 2R-2 are cross-sectional views of a semiconductor structure 100 after the formation of silicide layers 160 and a contact plug 162, in accordance with some embodiments of the disclosure. FIG. 2R-1 corresponds to cross-section A-A of FIG. 1 and FIG. 2R-2 corresponds to cross-section B-B of FIG. 1.

The silicide layers 160 are formed on the source/drain feature 132 and the source/drain feature 142 in the contact opening 158, as shown in FIGS. 2R-1 and 2R-2, in accordance with some embodiments. In some embodiments, the thickness of the silicide layers 160 (measured in the Z direction) is in a range from about 1 nm to about 5 nm.

In some embodiments, the silicide layers 160 are formed by depositing a metal layer over the semiconductor structure 100. The metal layer may be aluminum (Al), nickel (Ni), platinum (Pt), palladium (Pd), vanadium (V), titanium (Ta), cobalt (Co), tantalum (Ta), ytterbium (Y), zirconium (Zr), other suitable metal, or combinations thereof. One or more anneal processes may be performed on the semiconductor structure 100 such that portions the semiconductor materials of the source/drain features 132 and 142 contacting the metal layer react with the metal layer and are transformed into metal silicides such as nickel silicide (NiSi), titanium silicide (TiSi), titanium aluminum silicide (TiAlSi), or cobalt silicide (CoSi). Afterward, a portion of the metal layer unreacted with the semiconductor material may be removed using such as wet etching.

A contact plug 162 is formed in the contact opening 158, as shown in FIGS. 2R-1 and 2R-2, in accordance with some embodiments. The contact plug 162 extends through the interlayer dielectric layer 146, the contact etching stop layer 144, the germanium piled-up layer 137 and the silicon layer 134 to land on the silicide layers 160, in accordance with some embodiments. In some embodiments, the contact plug 162 continuously extends over a portion of the source/drain feature 132, the dielectric fin structure 112 and a portion of the source/drain feature 142, as shown in FIG. 2R-1, in accordance with some embodiments. In some embodiments, the contact etching stop layer 144 covers and contacts the sidewalls of the contact plug 162, as shown in FIG. 2R-2, in accordance with some embodiments. In some embodiments, the thickness of the contact plug 162 (measured in the Z direction) is in a range from about 5 nm to about 50 nm.

In some embodiments, the contact plug 162 is made of one or more conductive materials such as cobalt (Co), nickel (Ni), tungsten (W), titanium (Ti), tantalum (Ta), cupper (Cu), aluminum (Al), ruthenium (Ru), molybdenum (Mo), TiN, and TaN. In some embodiments, the conductive material is deposited in the contact opening 158 and over the interlayer dielectric layer 146 using CVD, PVD, e-beam evaporation, ALD, electroplating (ECP), electroless deposition (ELD), another suitable method, or a combination thereof. In some embodiments, a planarization process such as CMP is performed on the conductive material until the upper surface of the interlayer dielectric layer 146 is exposed. After the planarization process, the upper surfaces of the contact plug 162, the interlayer dielectric layer 146 and the metal gate electrode layers 156 are substantially coplanar, in accordance with some embodiments.

The contact plug 162 may have a multi-layer structure including, for example, liner layers, seed layers, adhesion (glue) layers, barrier layers, fill layers, and the like. In some embodiments, the fill layer is formed using a selective deposition technique such as a cyclic CVD process or an ELD process, and therefore it is not necessary to form glue layer in the opening before depositing the conductive material. In some embodiments, if the fill layer does not easily diffuse into the dielectric material, the barrier layer may be omitted. It is understood that the semiconductor structure 100 may undergo further CMOS processes to form various features over the semiconductor structure 100, such as a multilayer interconnect structure (e.g., contacts to gate, vias, lines, inter metal dielectric layers, passivation layers, etc.).

FIGS. 3-1 and 3-2 are enlarged views of area A of FIG. 2R-1 and area B of FIG. 2R-2, respectively, to further illustrate additional details, in accordance with some embodiments.

The source/drain features 132 include source/drain feature $132_1$ and source/drain feature $132_2$, as shown in FIGS. 3-1 and 3-2, in accordance with some embodiments. The contact plug 162 lands on the source/drain feature $132_2$, in accordance with some embodiments. The source/drain feature 132 has a first surface 132S1, a second surface 132S2, a third surface 132S3 and a fourth surface 132S4, each of which has specific crystalline orientation, in accordance with some embodiments. The first surface 132S1 is in connection with the fin structure 104N; the second surface 132S2 is above and in connection with the first surface 132S1; the third surface 132S3 is above and in connection with the second surface 132S2; the fourth surface 132S4 is above and in connection with the third surface 132S3, in accordance with some embodiments. The second surface 132S2 of the source/drain feature 132 conforms to and is interfaced with the sidewall of the dielectric fin structure 112, in accordance with some embodiments. In some embodiments, the fourth surface 132S4 is the top surface of the source/drain feature 132 and is located at a higher position than the upper surface of the dielectric fin structure 112.

The silicon layer 134 and the germanium piled-up layer 137, formed over the source/drain feature $132_1$, extend along the third surface 132S3 and the fourth surface 132S4 and contact the sidewall of the dielectric fin structure 112, as shown in FIG. 3-1, in accordance with some embodiments. In some embodiments, the silicon layer 134 and the germanium piled-up layer 137 are not formed on the first surface 132S1 and the second surface 132S2.

In some embodiments, the silicon layer 134 and the germanium piled-up layer 137, formed on the source/drain feature 132$_2$, are located between the dielectric fin structure 112 and the contact plug 162, as shown in FIG. 3-1, and between the uppermost inner spacer layer 128$_1$ and the contact plug 162, as shown in FIG. 3-2. In some embodiments, the silicon layer 134 and the germanium piled-up layer 137 partially cover the uppermost second semiconductor layer 108, as shown in FIG. 3-2, in accordance with some embodiments.

The uppermost inner spacer layers 128$_1$ have inner sidewalls 128S1 facing the final gate stack and outer sidewalls 128S2 facing away from the final gate stack, as shown in FIG. 3-2, in accordance with some embodiments. The gate spacer layers 124 have inner sidewalls 124S1 facing the final gate stack and outer sidewalls facing away from the final gate stack, as shown in FIG. 3-2, in accordance with some embodiments. The uppermost inner spacer layer 128$_1$ is offset from the gate spacer layer 124 toward the final gate stack, in accordance with some embodiments. That is, the inner sidewall 128S1 of the uppermost inner spacer layer 128$_1$ protrudes from the inner sidewall 124S1 of the gate spacer layer 124 toward the final gate stack; the outer sidewall 128S2 of the uppermost inner spacer layer 128$_1$ is indented from the outer sidewall 124S2 of the gate spacer layer 124 toward the final gate stack, in accordance with some embodiments. The upper surface of the uppermost inner spacer layer 128$_1$ is covered by the gate spacer layer 124 and the high-k gate dielectric layer 154. Furthermore, the silicon layer 134, the germanium piled-up layer 137 and the contact etching stop layer 144 include respective portions extending below the gate spacer layers 124, as shown in FIG. 3-2, in accordance with some embodiments.

Figures 2, 4:
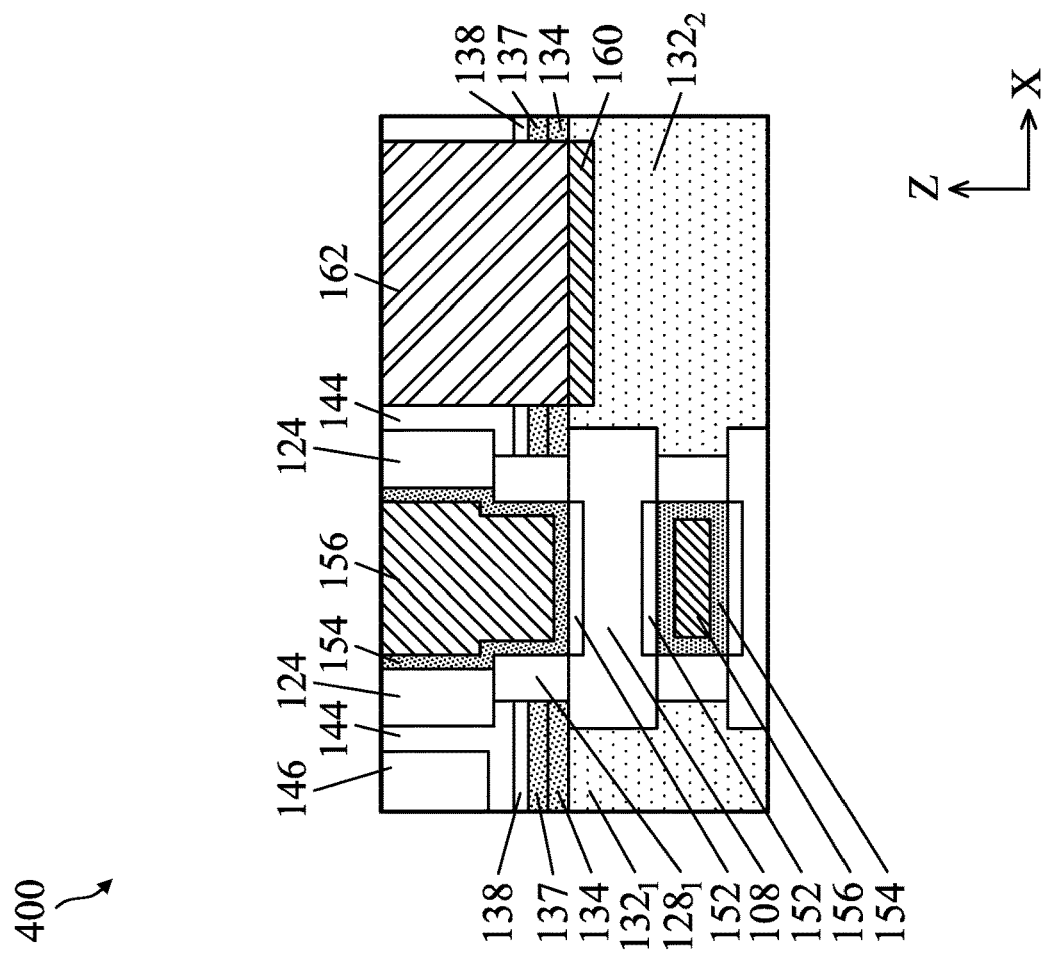
Figures 1, 4:
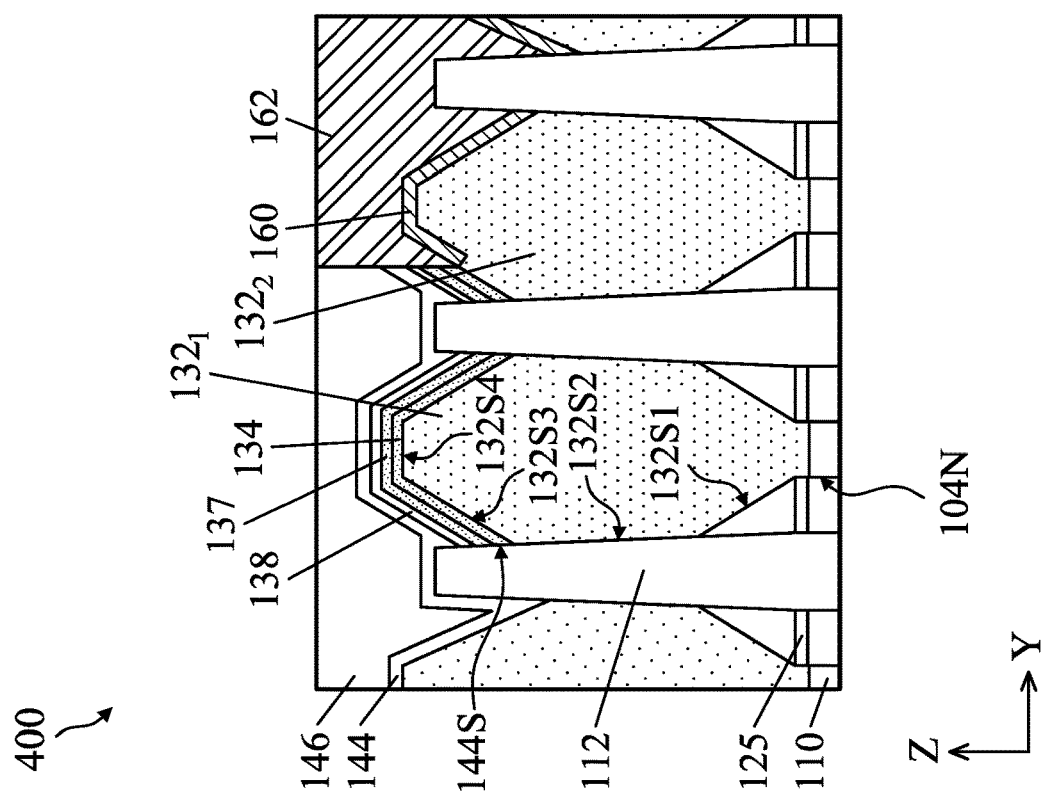

FIGS. 4-1 and 4-2 are a modification of the cross-section views of FIGS. 3-1 and 3-2, in accordance with some embodiments. FIGS. 4-1 and 4-2 illustrate a semiconductor structure 400 that is similar to the semiconductor structure 100 of FIGS. 3-1 and 3-2 except for a silicon oxide layer 138 between the germanium piled-up layer 137 and the contact etching stop layer 144, in accordance with some embodiments.

After the source/drain features 142 are formed (FIGS. 2M-1 and 2M-2), the silicon oxide layers 138 are not removed and the contact etching stop layer 144 is formed over the silicon oxide layer 138, in accordance with some embodiments. The contact plug 162 further passes through the silicon oxide layer 138 to land on the source/drain feature 132$_2$, in accordance with some embodiments.

In some embodiments, the silicon oxide layer 138, formed along the source/drain feature 132$_2$, is located between and in contact with the dielectric fin structure 112 and the contact plug 162, as shown in FIG. 4-1, in accordance with some embodiments. In some embodiments, the silicon oxide layer 138, formed along the source/drain feature 132$_2$, is located between and in contact with the uppermost inner spacer layer 128$_1$ and the contact plug 162, as shown in FIG. 4-2, in accordance with some embodiments. The silicon oxide layer 138 includes a portion extending below the gate spacer layers 124, as shown in FIG. 4-2, in accordance with some embodiments.

Figure 5:
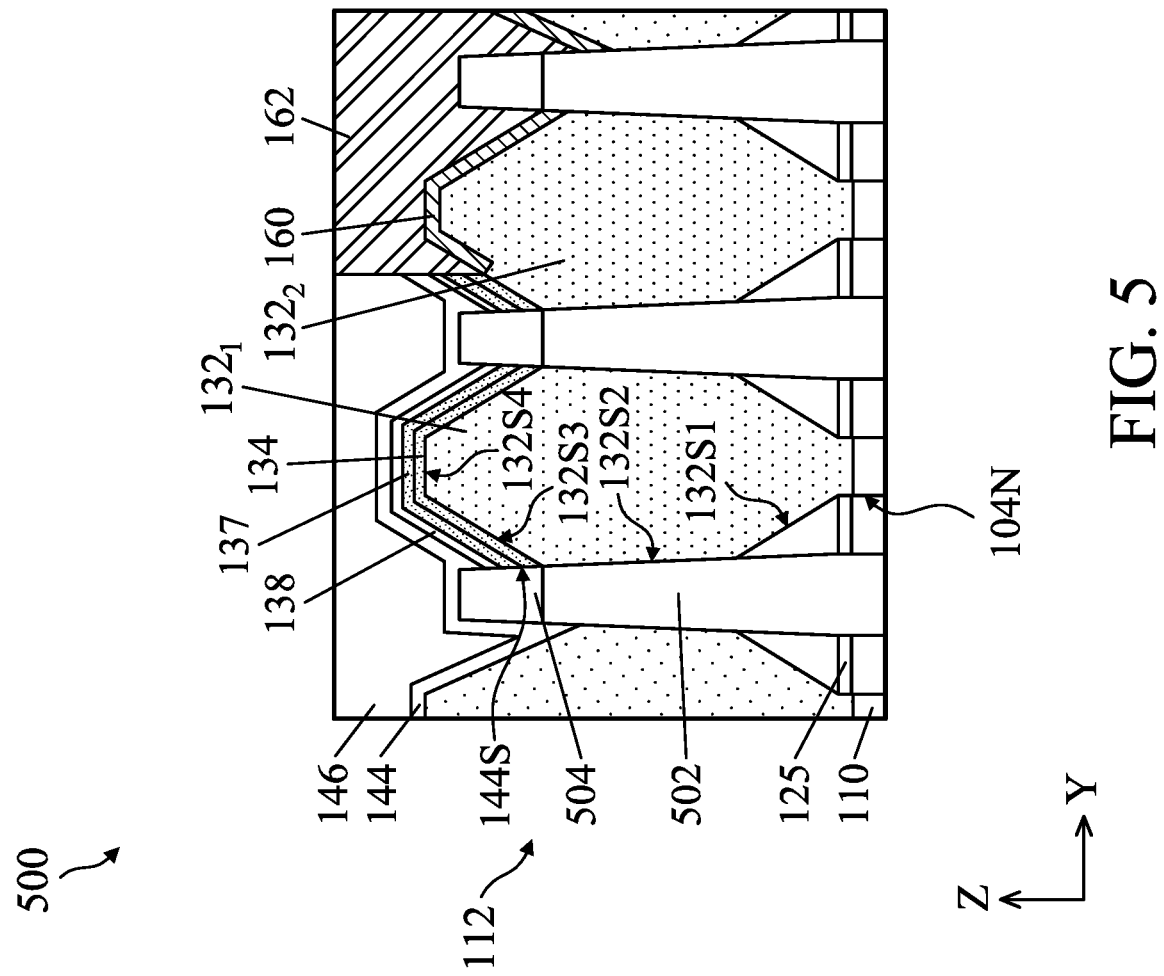
FIG. 5 is a modification of the cross-section views of FIG. 4-1, in accordance with some embodiments.

FIG. 5 is a modification of the cross-section view of FIG. 4-1, in accordance with some embodiments. FIG. 5 illustrates a semiconductor structure 500 that is similar to the semiconductor structure 500 of FIG. 4-1 except the dielectric fin structure 112 is formed from a first dielectric layer 502 and a second dielectric layer 504, in accordance with some embodiments.

The dielectric fin structure 112 includes a first dielectric layer 502 and a second dielectric layer 504 over the first dielectric layer 502, as shown in FIG. 5-1, in accordance with some embodiments. In some embodiments, the second dielectric layer 504 has a higher dielectric constant than first dielectric layer 502. In some embodiments, the first dielectric layer 502 is made of a dielectric material with a dielectric constant less than about 7, e.g., SiN SiCN, SiOC, SiOCN, or a combination thereof. In some embodiments, the second dielectric layer 504 is made of a dielectric material with a dielectric constant greater than about 7, e.g., $Al_2O_3$, $HfO_2$, $ZrO_2$, HfAlO, HfSiO, or a combination thereof. The second dielectric layer 504 with high dielectric constant may serve as an etching stop layer during the cutting process as described above. In some embodiments, the silicon layer 134, the germanium piled-up layer 137 and the silicon oxide layer 138 are in contact with the second dielectric layer 504 of the dielectric fin structure 512, as shown in FIG. 5-1, in accordance with some embodiments.

Figures 1, 6:
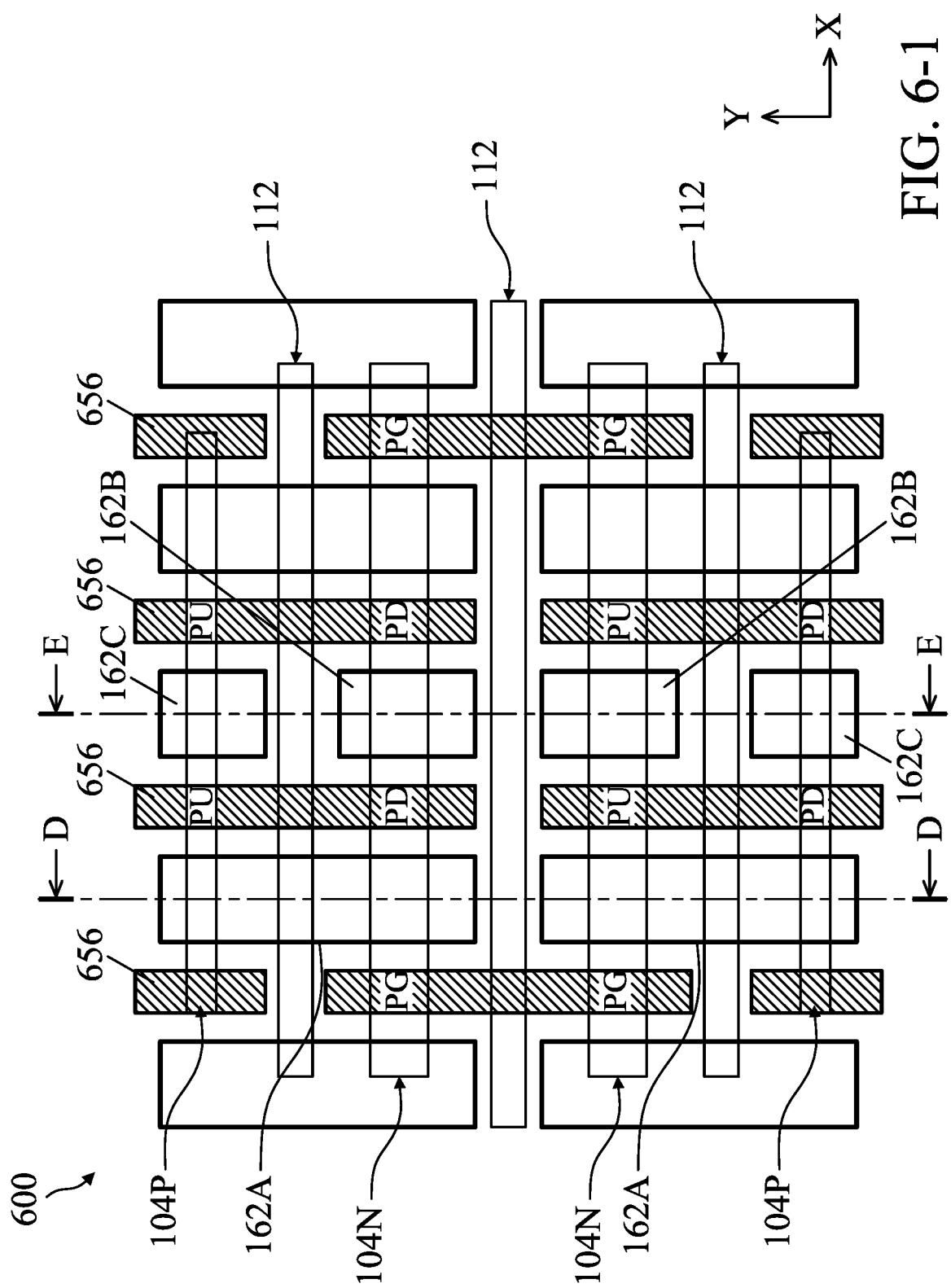
Figures 2, 3, 6:
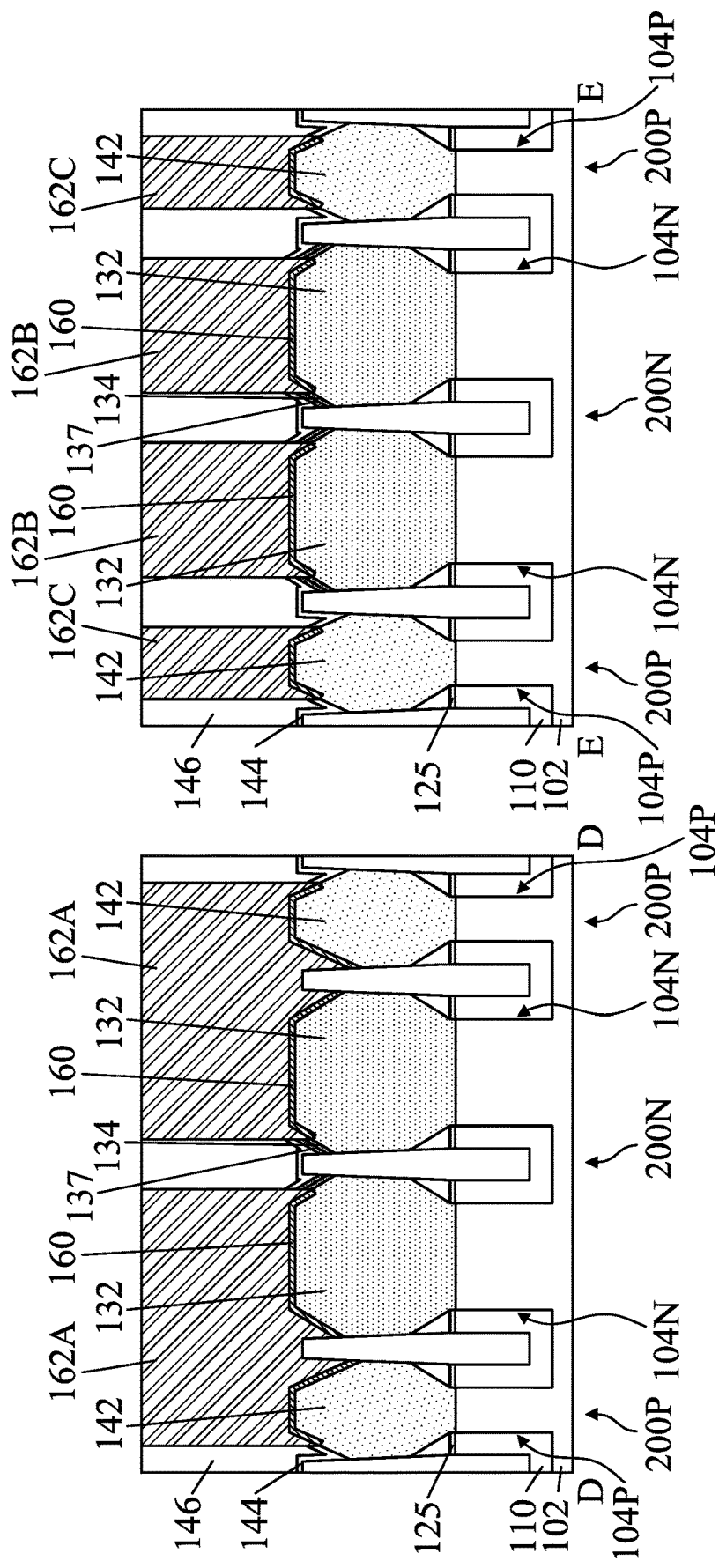

The method of the embodiments of the present disclosure may be applied for a statistic random-access memory (SRAM) structure with gate-all-around design. FIG. 6-1 is a top view of a part of a statistic random-access memory (SRAM) structure 600 including gate-all-around transistors, in accordance with some embodiments of the disclosure. The statistic random-access memory structure 600 includes various transistors such as pull-up transistors PU, pull-down transistors PD, and pass-gate transistors PG, as shown in FIGS. 6-1, in accordance with some embodiments. These transistors are the gate-all-around field effect transistors formed using the method as described above with respect to FIGS. 2A-1 through 2R-2, in accordance with some embodiments.

FIG. 6-1 merely illustrate fin structures 104N and 104P, dielectric fin structures 112, sub-gate stacks 656, contact plugs 162A, 162B and 162C for illustrative purpose. The fin structures 104N may be formed with a greater width (measured in the Y direction) than the fin structures 104P for the memory performance consideration. For example, the width of the fin structures 104N may be in a range from about 3 nm to about 10 nm and the width of the fin structures 104P may be in a range from about 3 nm to about 10 nm.

The sub-gate stack 656 may be formed by performing a cutting process as described above on the final gate stacks. The transistors PU, PD and PG of the statistic random-access memory structure 600 are formed at cross points of the fin structures 104N/104P and the sub-gate stack 656, in accordance with some embodiments.

FIGS. 6-2 and 6-3 are cross-section views of a part of the statistic random-access memory structure 600 of FIG. 6-1, in accordance with some embodiments of the disclosure. FIG. 6-2 corresponds to cross-section D-D of FIG. 6-1 and FIG. 6-3 corresponds to cross-section C-C of FIG. 6-1. The contact plugs 162A continuously extends over the source/drain feature 142 (on the fin structure 104P), the dielectric fin structure 112, the source/drain feature 132 (on the fin structure 104N), as shown in FIGS. 6-1 and 6-2, in accordance with some embodiments. The contact plug 162B lands on a single source/drain feature 132 (on the fin structure 104N) and the contact plug 162C lands on a single source/drain feature 142 (on the fin structure 104P), as shown in FIGS. 6-1 and 6-3, in accordance with some embodiments.

As described above, the method for forming a semiconductor structure includes forming an N-type source/drain feature 132 in a source/drain recess 126N in an NMOS region 200N while a mask element 130 covers a PMOS region 200P, forming a silicon germanium layer 136 over the N-type source/drain feature 132, oxidizing the silicon germanium layer 136 to form a silicon oxide layer 138, removing the mask element 130, forming a P-type source/drain feature 142 in the a source/drain recess 126P in the PMOS region 200P. Because the silicon oxide layer 138 over the N-type source/drain feature 132 serves as mask element during the formation of the P-type source/drain feature 142, additional photolithography process is not required and the risk of CD/overlay shift may be avoided. Therefore, the yield and the performance of the resulting semiconductor device may be improved.

Embodiments for forming a semiconductor structure may be provided. The semiconductor structure may include nanowire structures, gate stacks formed around the nanowire structures, and source/drain features adjoining the nanowire structures. A silicon oxide layer may be formed self-aligned over a first source/drain feature and may serve as a mask element during forming a second source/drain feature. As a result, additional photolithography process is not required and the risk of CD/overlay shift may be avoided.

In some embodiments, a semiconductor structure is provided. The semiconductor structure includes nanostructures over a substrate, a gate stack around the nanostructures, a gate spacer layer alongside the gate stack, an inner spacer layer between the gate spacer layer and the nanostructures, a source/drain feature adjoining the nanostructures, a contact plug over the source/drain feature, and a silicon germanium layer along the surface of the source/drain feature and between the contact plug and the inner spacer layer.

In some embodiments, a semiconductor structure is provided. The semiconductor structure includes a first semiconductor fin structure and a first dielectric fin structure over a substrate, first nanostructures over the first semiconductor fin structure, a gate stack extending across the first nanostructures and the first dielectric fin structure, a first source/drain feature over the first semiconductor fin structure, and a germanium piled-up layer over the first source/drain feature and in contact with the first dielectric fin structure. The first source/drain feature is adjoining the first nanostructures and in contact with the first dielectric fin structure.

In some embodiments, a method for forming a semiconductor structure is provided. The method includes alternatingly stacking first semiconductor layers and second semiconductor layers over a substrate, patterning the first semiconductor layers and the second semiconductor layers to form a first fin structure in a first region of the substrate and a second fin structure in a second region of the substrate, forming a dielectric fin structure between the first fin structure and the second fin structure, etching the first fin structure to form a first source/drain recess and etching the second fin structure to form a second source/drain recess, forming a mask element over the second region of the substrate, forming a first source/drain feature in the first source/drain recess. The first source/drain feature is interfaced with the dielectric fin structure. The method also includes forming a silicon germanium layer over the first source/drain feature, oxidizing the silicon germanium layer, removing the mask element, and forming a second source/drain feature in the second source/drain recess. The second source/drain feature is interfaced with the dielectric fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    alternatingly stacking first semiconductor layers and second semiconductor layers over a substrate;
    patterning the first semiconductor layers and the second semiconductor layers to form a first fin structure in a first region of the substrate and a second fin structure in a second region of the substrate;
    forming a dielectric fin structure between the first fin structure and the second fin structure;
    etching the first fin structure to form a first source/drain recess and etching the second fin structure to form a second source/drain recess;
    forming a mask element over the second region of the substrate;
    forming a first source/drain feature in the first source/drain recess, wherein the first source/drain feature is interfaced with the dielectric fin structure;
    forming a silicon germanium layer over the first source/drain feature;
    oxidizing the silicon germanium layer;
    removing the mask element; and
    forming a second source/drain feature in the second source/drain recess, wherein the second source/drain feature is interfaced with the dielectric fin structure.

2. The method for forming the semiconductor structure as claimed in claim 1, further comprising, after forming the first source/drain recess and the second source/drain recess:
    laterally recessing the first semiconductor layers of the first fin structure to form first notches and laterally recessing the first semiconductor layers of the second fin structure to form second notches; and
    filling the first notches with first inner spacer layers and the second notches with second inner spacer layers,
    wherein the silicon germanium layer is formed in contact with one of the first inner spacer layers.

3. The method for forming the semiconductor structure as claimed in claim 2, further comprising:
    forming a dummy gate structure across the first fin structure, the dielectric fin structure and the second fin structure; and
    forming a gate spacer layer alongside the dummy gate structure,
    wherein a bottom surface of the gate spacer layer is exposed after laterally recessing the first semiconductor layers of the first fin structure and laterally recessing the first semiconductor layers of the second fin structure.

4. The method for forming the semiconductor structure as claimed in claim 2, further comprising:
    removing the first semiconductor layers of the first fin structure to form first nanostructures from the second semiconductor layers of the first fin structure and removing the first semiconductor layers of the second fin structure to form second nanostructures from the second semiconductor layers of the second fin structure; and forming a gate dielectric layer around the first nanostructures and the second nanostructures, wherein the gate dielectric layer partially covers an upper surface of the one of the first inner spacer layers.

5. The method for forming the semiconductor structure as claimed in claim 1, further comprising:

forming a dielectric layer over the first source/drain feature and the second source/drain feature;

forming a contact opening through the dielectric layer and the germanium piled-up layer to expose the first source/drain feature, the dielectric fin structure and the second source/drain feature; and forming a contact plug in the contact opening.

6. A method for forming a semiconductor structure, comprising:

forming a first fin structure and a second fin structure over a substrate, wherein each of the first fin structure and the second fin structure comprises first semiconductor layers and second semiconductor layers alternatingly stacked;

covering the second fin structure with a first mask element;

growing a first source/drain feature over the first fin structure;

forming a second mask element to cover the first source/drain feature, wherein the second mask element is separate from the first mask element;

removing the first mask element after forming the second mask element;

growing a second source/drain feature over the second fin structure;

removing the first semiconductor layers of each of the first fin structure and the second fin structure, thereby forming first nanostructures and second nanostructures from the second semiconductor layers of the first fin structure and the second fin structure respectively; and forming a gate stack around the first nanostructures and the second nanostructures.

7. The method for forming the semiconductor structure as claimed in claim 6, further comprising:

growing a silicon layer over the first source/drain feature;

growing a silicon germanium layer over the silicon layer; and oxidizing the silicon germanium layer to form the second mask element.

8. The method for forming the semiconductor structure as claimed in claim 7, wherein the silicon germanium layer is oxidized to form a germanium piled-up layer below the second mask element and over the silicon layer.

9. The method for forming the semiconductor structure as claimed in claim 8, further comprising:

removing the second mask element after growing the second source/drain feature, thereby exposing the germanium piled-up layer.

10. The method for forming the semiconductor structure as claimed in claim 7, wherein the silicon layer is partially consumed during oxidizing the silicon germanium layer.

11. The method for forming the semiconductor structure as claimed in claim 7, wherein the first source/drain feature, the silicon layer and the silicon germanium layer are grown continuously in a single process tool.

12. The method for forming the semiconductor structure as claimed in claim 7, wherein a concentration of the silicon germanium layer is in a range from about 20 atomic % to about 75 atomic %.

13. The method for forming the semiconductor structure as claimed in claim 6, further comprising:

forming a first dielectric fin structure, a second dielectric fin structure and a third dielectric fin structure over the substrate, wherein the first source/drain is grown between the second dielectric fin structure and the third dielectric fin structure, and the second source/drain is grown between the first dielectric fin structure and the second dielectric fin structure.

14. The method for forming the semiconductor structure as claimed in claim 13, wherein the first mask layer has an end located at an upper surface of the second dielectric fin structure.

15. The method for forming the semiconductor structure as claimed in claim 13, wherein the second mask layer has an end in contact with a sidewall of the second dielectric fin structure.

16. A method for forming a semiconductor structure, comprising:

forming a first fin structure over a substrate, wherein the first fin structure comprises first semiconductor layers and second semiconductor layers alternatingly stacked;

etching the first fin structure to form a first source/drain recess;

laterally recessing the first semiconductor layers of the first fin structure to form notches;

forming inner spacer layers in the notches;

growing a first source/drain feature in the first source/drain recess;

growing a silicon germanium layer over the first source/drain feature and in contact with an uppermost one of the inner spacer layers;

oxidizing the silicon germanium layer to form a silicon oxide layer;

removing the first semiconductor layers of the first fin structure, thereby forming first gaps between the second semiconductor layers of the first fin structure; and forming a gate stack to fill the first gaps.

17. The method for forming the semiconductor structure as claimed in claim 16, further comprising:

forming a dummy gate structure over a channel region of the first fin structure; and forming a gate spacer layer along a sidewall of the dummy gate structure, wherein the gate spacer layer extends beyond an edge of the uppermost one of the inner spacer layers.

18. The method for forming the semiconductor structure as claimed in claim 16, further comprising:

growing a silicon layer over the first source/drain feature, wherein the silicon germanium layer is grown over the silicon layer, and the silicon layer is in contact with the uppermost one of the inner spacer layers.

19. The method for forming the semiconductor structure as claimed in claim 16, further comprising:

forming a second fin structure laterally spaced apart from the first fin structure, wherein the second fin structure comprises third semiconductor layers and fourth semiconductor layers alternatingly stacked;

etching the second fin structure to form a second source/drain recess;

growing a second source/drain feature in the second source/drain recess, wherein the silicon oxide layer prevents the second source/drain feature from being grown over the first source/drain feature;

removing the third semiconductor layers of the second fin structure, thereby forming second gaps between the fourth semiconductor layers of the second fin structure; and forming the gate stack to fill the second gaps.

20. The method for forming the semiconductor structure as claimed in claim 19, wherein the first source/drain feature and the second source/drain feature are doped with different conductive types.

* * * * *